US009887207B2

(12) United States Patent
Zhang et al.

(10) Patent No.: US 9,887,207 B2
(45) Date of Patent: Feb. 6, 2018

(54) THREE DIMENSIONAL NAND DEVICE HAVING DUMMY MEMORY HOLES AND METHOD OF MAKING THEREOF

(71) Applicant: SanDisk Technologies, Inc., Plano, TX (US)

(72) Inventors: Yanli Zhang, San Jose, CA (US); Raghuveer S. Makala, Campbell, CA (US); Johann Alsmeier, San Jose, CA (US); Yao-Sheng Lee, Tampa, FL (US); Tiger Xu, Kuwana-gun (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 55 days.

(21) Appl. No.: 14/462,209

(22) Filed: Aug. 18, 2014

(65) Prior Publication Data
US 2016/0049421 A1     Feb. 18, 2016

(51) Int. Cl.
*H01L 27/105* (2006.01)
*H01L 29/78* (2006.01)
(Continued)

(52) U.S. Cl.
CPC .. *H01L 27/11582* (2013.01); *H01L 21/02532* (2013.01); *H01L 21/31111* (2013.01);
(Continued)

(58) Field of Classification Search
CPC ......... H01L 27/11556; H01L 27/11575; H01L 27/11582; H01L 27/11548; H01L 27/1157;
(Continued)

(56) References Cited

U.S. PATENT DOCUMENTS

| 5,915,167 | A | 6/1999 | Leedy |
| 2012/0069662 | A1* | 3/2012 | Sakurai ............. G11C 16/0483 365/185.11 |

(Continued)

FOREIGN PATENT DOCUMENTS

WO     2016028466 A1     2/2016

OTHER PUBLICATIONS

Endoh, et al., "Novel Ultra High Density Memory with a Stacked-Surrounding Gate Transistor (S-SGT) Structured Cell," IEDM Proc. (2001) 33-36.
(Continued)

*Primary Examiner* — Dale E Page
*Assistant Examiner* — Paul Budd
(74) *Attorney, Agent, or Firm* — The Marbury Law Group PLLC

(57) ABSTRACT

A monolithic three dimensional NAND string includes a plurality of control gate electrodes extending substantially parallel to a major surface of a substrate, a memory opening extending substantially perpendicular to the major surface of the substrate and filled with a memory opening material including a memory film, and a dummy opening extending substantially perpendicular to the major surface of the substrate and filled with a dummy channel material which is different from the memory opening material. The dummy channel material has a higher Young's modulus than the memory opening material to offset warpage of the substrate due to the one of compressive and tensile stress imposed by the plurality of control gate electrodes on the substrate.

25 Claims, 42 Drawing Sheets

(51) Int. Cl.

| | | |
|---|---|---|
| H01L 29/792 | (2006.01) | |
| H01L 21/28 | (2006.01) | |
| H01L 21/334 | (2006.01) | |
| H01L 21/8232 | (2006.01) | |
| H01L 21/8239 | (2006.01) | |
| H01L 27/11582 | (2017.01) | |
| H01L 27/11556 | (2017.01) | |
| H01L 29/788 | (2006.01) | |
| H01L 21/311 | (2006.01) | |
| H01L 21/3213 | (2006.01) | |
| H01L 29/49 | (2006.01) | |
| H01L 21/02 | (2006.01) | |
| H01L 29/16 | (2006.01) | |
| H01L 27/11578 | (2017.01) | |
| H01L 27/11548 | (2017.01) | |
| H01L 27/11575 | (2017.01) | |

(52) U.S. Cl.
CPC .. *H01L 21/32133* (2013.01); *H01L 27/11548* (2013.01); *H01L 27/11556* (2013.01); *H01L 27/11575* (2013.01); *H01L 27/11578* (2013.01); *H01L 29/16* (2013.01); *H01L 29/495* (2013.01); *H01L 29/7845* (2013.01); *H01L 29/7883* (2013.01); *H01L 29/7926* (2013.01)

(58) Field of Classification Search
CPC ......... H01L 27/11551; H01L 27/11578; H01L 21/8221
See application file for complete search history.

(56) References Cited

U.S. PATENT DOCUMENTS

| | | | |
|---|---|---|---|
| 2012/0208347 A1* | 8/2012 | Hwang | H01L 27/1157 438/430 |
| 2013/0193503 A1* | 8/2013 | Lee | H01L 27/11582 257/314 |
| 2013/0248965 A1* | 9/2013 | Nakai | H01L 29/788 257/315 |
| 2014/0054670 A1 | 2/2014 | Lee et al. | |
| 2014/0183749 A1* | 7/2014 | Lee | H01L 27/1157 257/773 |
| 2015/0236038 A1* | 8/2015 | Pachamuthu | H01L 27/11582 257/326 |

OTHER PUBLICATIONS

International Application No. PCT/US2015/043096, International Search Report, dated Nov. 9, 2015, 5pgs.
International Application No. PCT/US2015/043096, Written Opinion of the International Search Authority, dated Feb. 25, 2016, 7pgs.
Bhushan et al., "Micromechanical and Tribological Characterization of Doped Single-Crystal Silicon and Polysilicon Films for Microelectromechanical Systems Devices," Journal of Materials Research, vol. 12, No. 1, Jan. 1997.
Gavan et al., "Size Dependent Effective Young's Modulus of Silicon Nitride Cantilevers," Applied Physics Letters, 94, 233108 (2009).
Gunthner et al., "Conversion Behavior and Resulting Mechanical Properties of Polysilazane-based Coatings," Journal of the European Ceramic Society, 32 (2012) pp. 1883-1892.
International Preliminary Report on Patentability and Written Opinion of the International Searching Authority for International Application No. PCT/US2015/043096, dated Mar. 2, 2017, 9 pages.

* cited by examiner

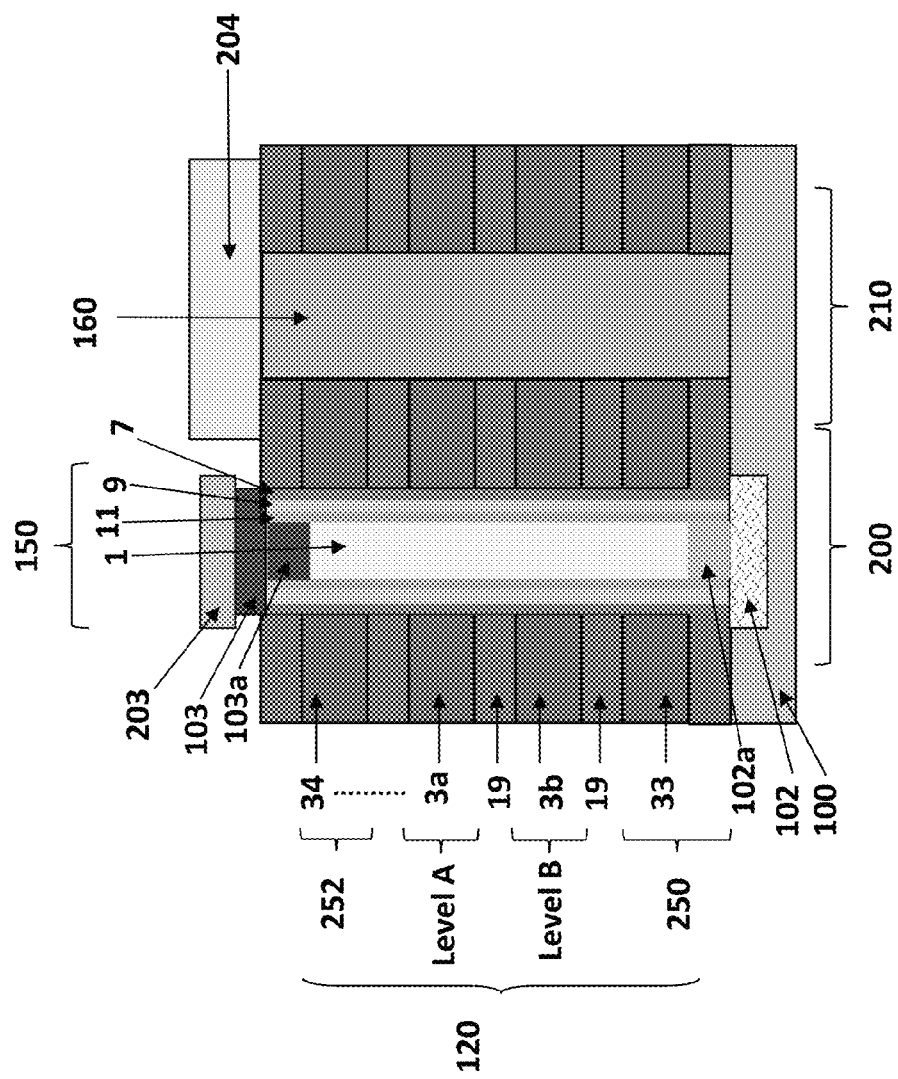

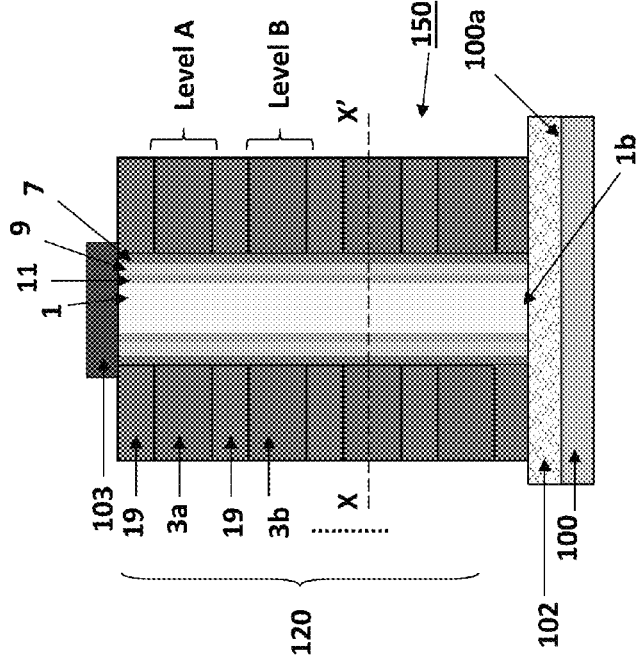
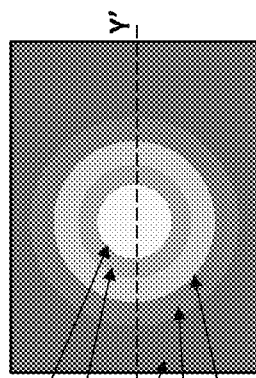
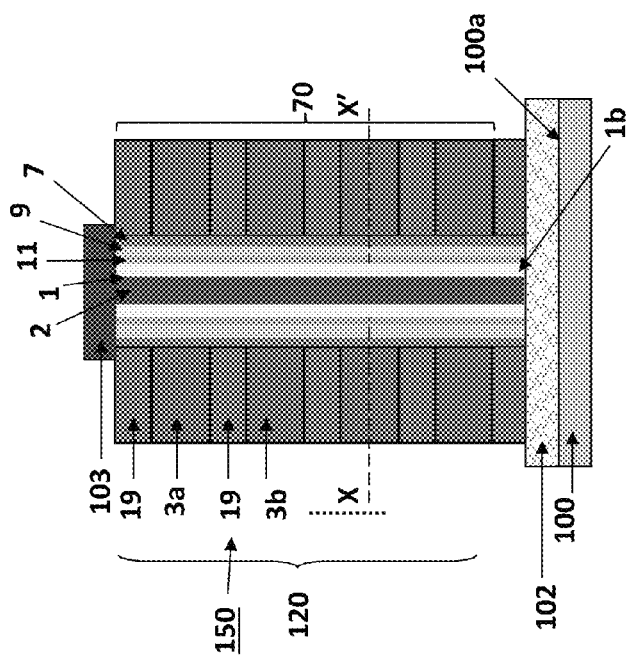
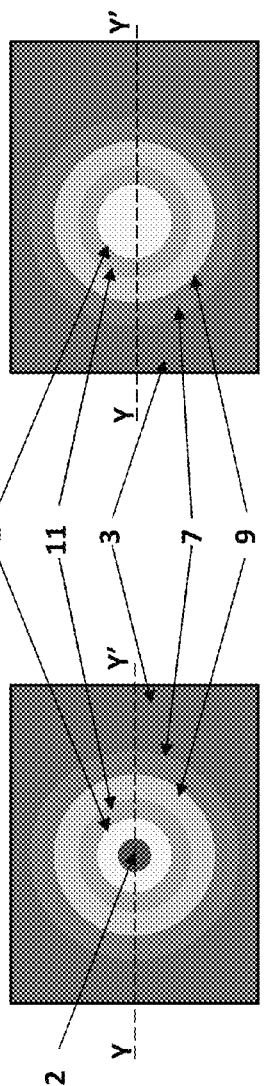

THREE DIMENSIONAL NAND DEVICE HAVING DUMMY MEMORY HOLES AND METHOD OF MAKING THEREOF

FIELD

The present disclosure relates generally to the field of semiconductor devices and specifically to three dimensional vertical NAND strings and other three dimensional devices and methods of making thereof.

BACKGROUND

Three dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to one embodiment of the disclosure, a method of making a monolithic three dimensional NAND device comprises forming a stack of alternating first layers and second layers; etching the stack to form at least one memory opening and at least one dummy opening in the stack; forming a memory opening material comprising a semiconductor channel and a memory film in the at least one memory opening; forming a dummy channel material in the at least one dummy opening; and forming a bit line over the semiconductor channel and the memory film located in the at least one memory opening; wherein the dummy channel material has a higher Young's modulus than the memory opening material.

According to another embodiment of the disclosure, a monolithic three dimensional NAND device comprises a plurality of control gate electrodes extending substantially parallel to the major surface of the substrate, the plurality of control gate electrodes comprising at least a first control gate electrode located in a first device level and a second control gate electrode located in a second device level located over the major surface of the substrate and below the first device level, and wherein the plurality of control gate electrodes extend through at least one memory cell region and at least one dummy channel region; an interlevel insulating layer located between the first control gate electrode and the second control gate electrode; a memory opening located in the at least one memory cell region and extending substantially perpendicular to the major surface of the substrate, the memory opening filled with a memory opening material; one of a source or drain electrode; and at least one dummy opening located in the at least one dummy channel region, the at least one dummy opening extending substantially perpendicular to the major surface of the substrate and filled with a dummy channel material which is different from the memory opening material. The dummy channel material has a higher Young's modulus than the memory opening material to offset warpage of the substrate due to one of compressive and tensile stress imposed by the plurality of control gate electrodes on the substrate. The memory opening material comprises a semiconductor channel located at least partially in the memory opening, at least one end portion of the semiconductor channel extending substantially perpendicular to the major surface of the substrate, at least one first portion of the semiconductor channel located in a first device level, and at least one second portion of the semiconductor channel located in a second device level; and at least one memory film located at least partially in the memory opening and adjacent to the semiconductor channel. The one of a source or drain electrode contacts the semiconductor channel from above or below.

According to another embodiment of the disclosure, a monolithic three dimensional NAND memory device comprises a silicon substrate; an array of monolithic three dimensional NAND strings having a plurality of device levels disposed above the silicon substrate; and a driver circuit associated with the array located above or in the silicon substrate. Each monolithic three dimensional NAND string comprises a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level, and wherein the plurality of control gate electrodes extend through at least one memory cell region and at least one dummy channel region; an interlevel insulating layer located between the first control gate electrode and the second control gate electrode; a memory opening located in the at least one memory cell region and extending substantially perpendicular to the major surface of the substrate, the memory opening filled with a memory opening material; and one of a source or drain electrode. The memory opening material comprises a semiconductor channel located at least partially in the memory opening, at least one end portion of the semiconductor channel extending substantially perpendicular to the major surface of the substrate, at least one first portion of the semiconductor channel located in a first device level, and at least one second portion of the semiconductor channel located in a second device level; and at least one memory film located at least partially in the memory opening. The one of a source or drain electrode contacts the semiconductor channel from above or below. The NAND memory device further comprises at least one dummy opening located in the at least one dummy channel region, the at least one dummy opening extending substantially perpendicular to the major surface of the substrate and filled with a dummy channel material which is different from the memory opening material. The plurality of control gate electrodes are under one of compressive and tensile stress and the dummy channel material has a higher Young's modulus than the memory opening material to offset warpage of the substrate due to the one of compressive and tensile stress imposed by the plurality of control gate electrodes on the substrate.

BRIEF DESCRIPTION OF THE DRAWINGS

FIG. 2B is a side cross sectional view of the device along line B-B' in FIG. 2A, while FIG. 2C is a side cross sectional view of the device along line W-W' in FIG. 2A.

FIG. 3A is a side cross sectional view of a NAND string and dummy channel according to an alternative embodiment of the disclosure.

FIGS. 4A and 4B are respectively side cross sectional and top cross sectional views of a NAND string of one embodiment. FIG. 4A is a side cross sectional view of the device along line Y-Y' in FIG. 4B, while FIG. 4B is a side cross sectional view of the device along line X-X' in FIG. 4A.

FIGS. 4C and 4D are respectively side cross sectional and top cross sectional views of a NAND string of one embodiment. FIG. 4C is a side cross sectional view of the device along line Y-Y' in FIG. 4D, while FIG. 4D is a side cross sectional view of the device along line X-X' in FIG. 4C.

DETAILED DESCRIPTION

Embodiments of the present disclosure will be described below with reference to the accompanying drawings. It should be understood that the following description is intended to describe various embodiments of the disclosure, and not to limit the disclosure.

The embodiments of the disclosure provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 1:
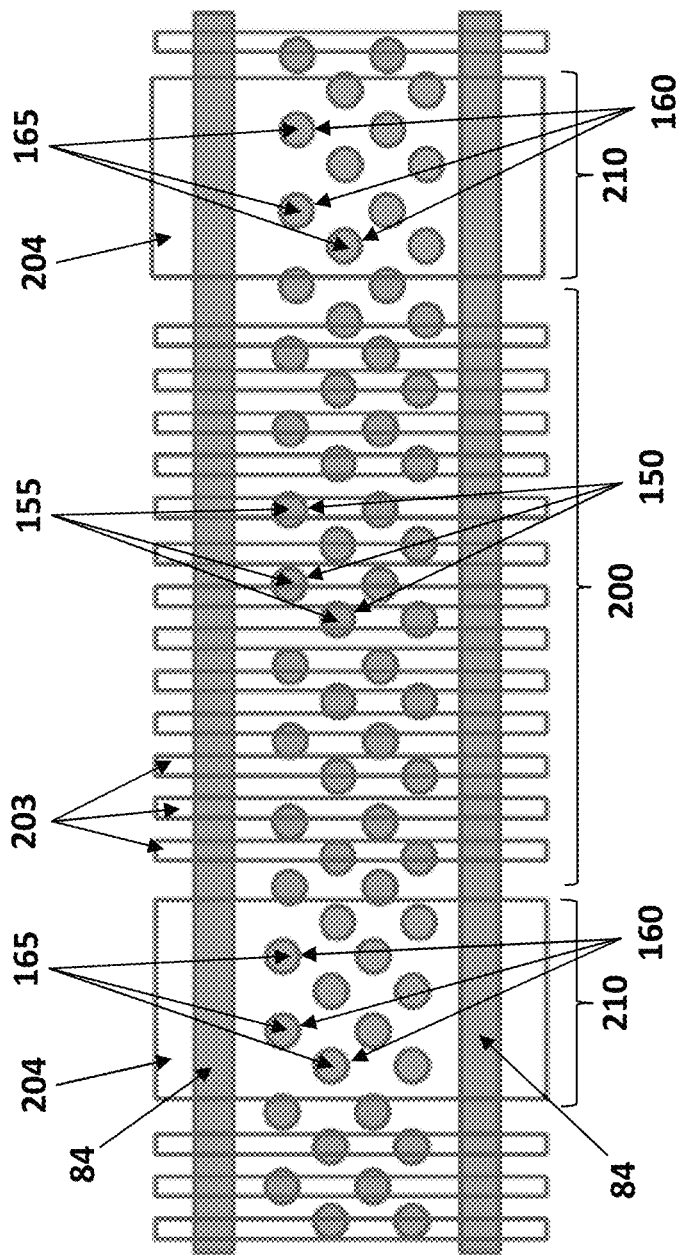
FIG. 1 is a schematic top view of a memory device according to embodiments of the disclosure.
Figure 2A:
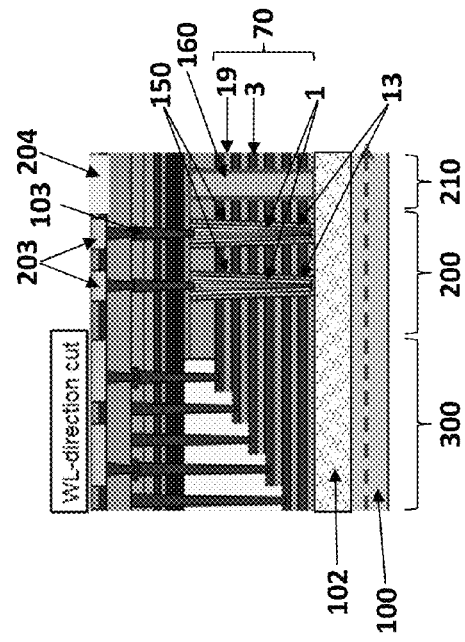
FIG. 2A is a top view of a memory block of an embodiment of the disclosure.
Figure 2C:
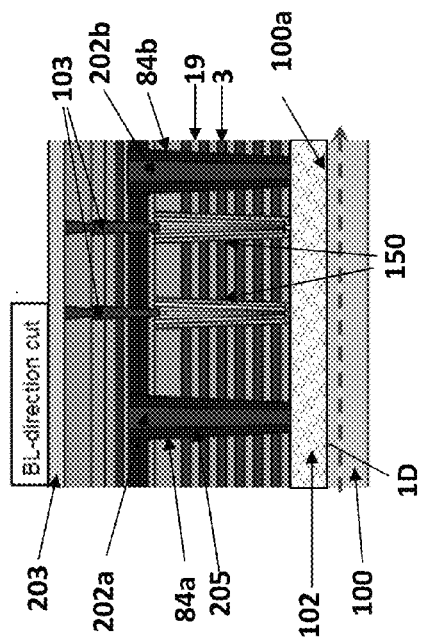
FIGS. 2B and 2C are side cross sectional views of the memory block of FIG. 2A along the bit line B-B' and word line W-W' directions, respectively.
Figure 2B:
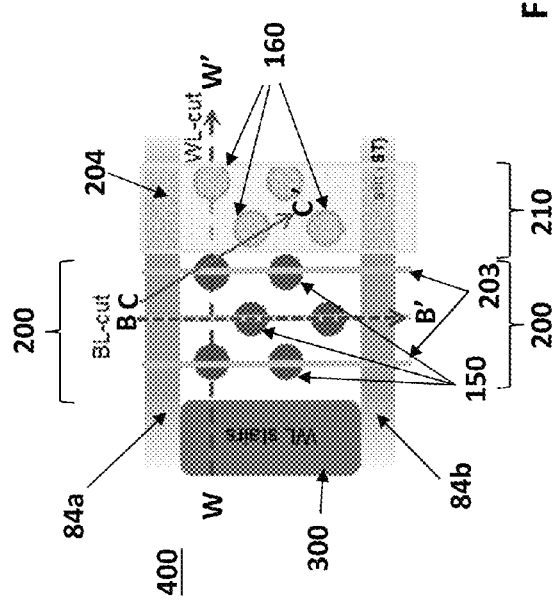

FIGS. 1 and 2A are top views of a memory block of embodiments of the disclosure. FIGS. 2B and 2C are side cross sectional views of the memory block of FIG. 2A along the bit line and word line directions, respectively. FIG. 2B is a side cross sectional view of the device along line B-B' in FIG. 2A, while FIG. 2C is a side cross sectional view of the device along line W-W' in FIG. 2A.

In some embodiments, the monolithic three dimensional NAND memory device comprises at least one NAND memory cell region 200 and at least one dummy channel region 210, as shown in FIGS. 1, 2A, and 2C. The memory cell region 200 comprises an array of monolithic three dimensional NAND strings 150 filled with a memory opening material 155 comprising a memory film 13, a semiconductor channel 1, and optionally an insulating fill material 2. The dummy channel region 210 comprises an array of dummy channels 160 filled with a dummy channel material 165.

As shown in FIGS. 2B and 2C, the monolithic three dimensional NAND memory device further comprises a plurality of control gate electrodes 3 separated by a plurality of insulating layers 19, each of which extend substantially parallel to a major surface 100a of a substrate 100.

Figure 32:
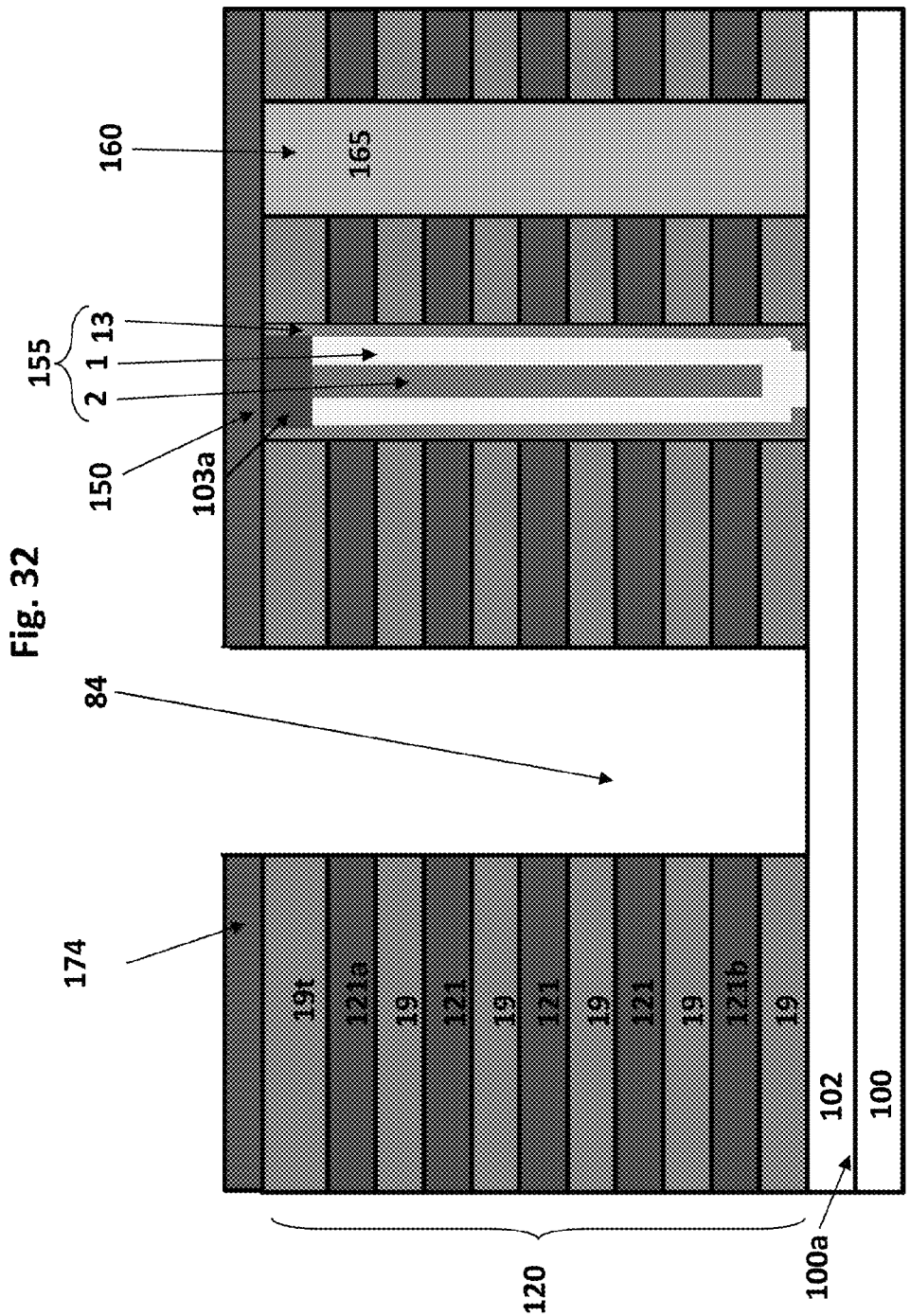
Figure 33:
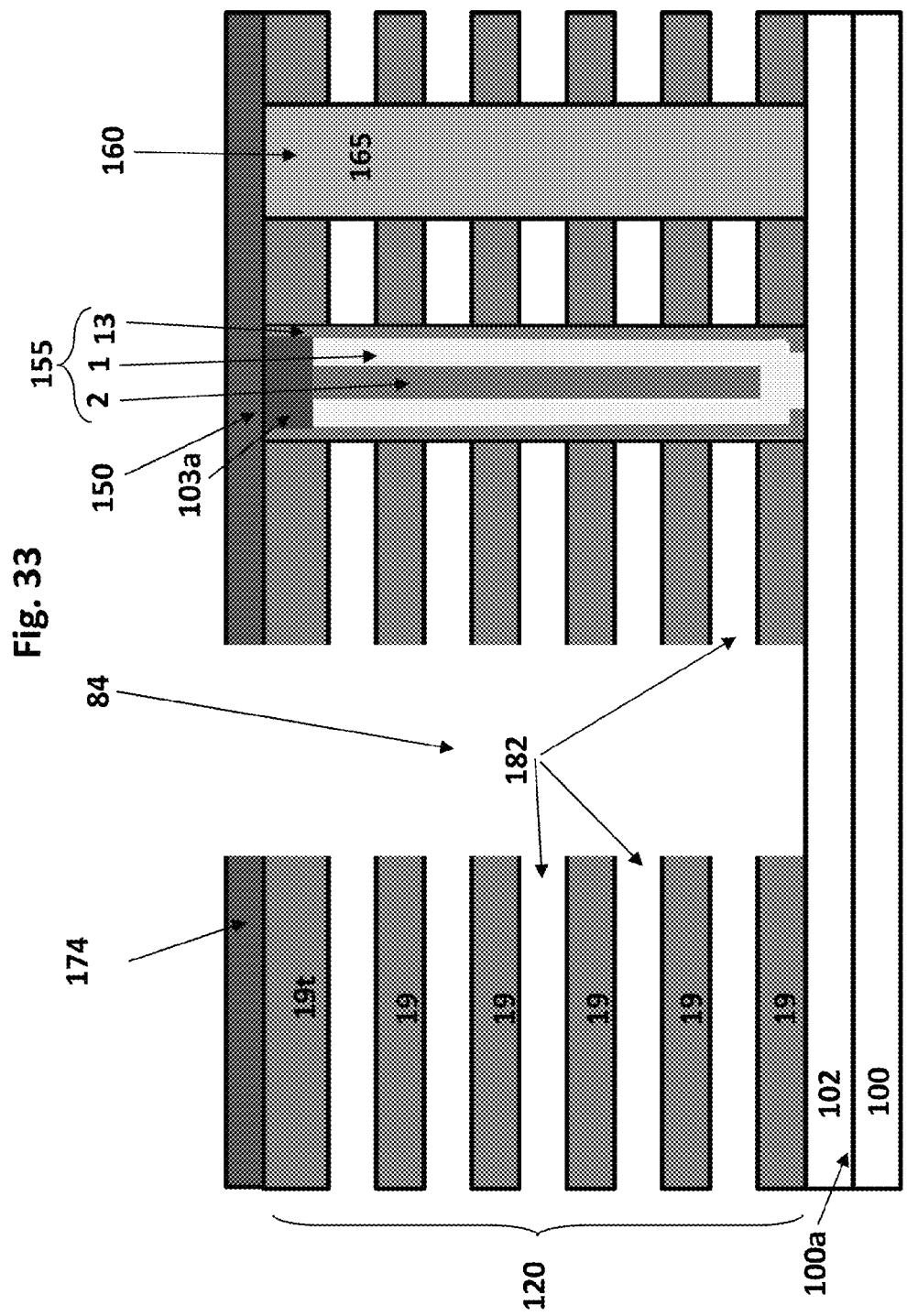
Figure 34:
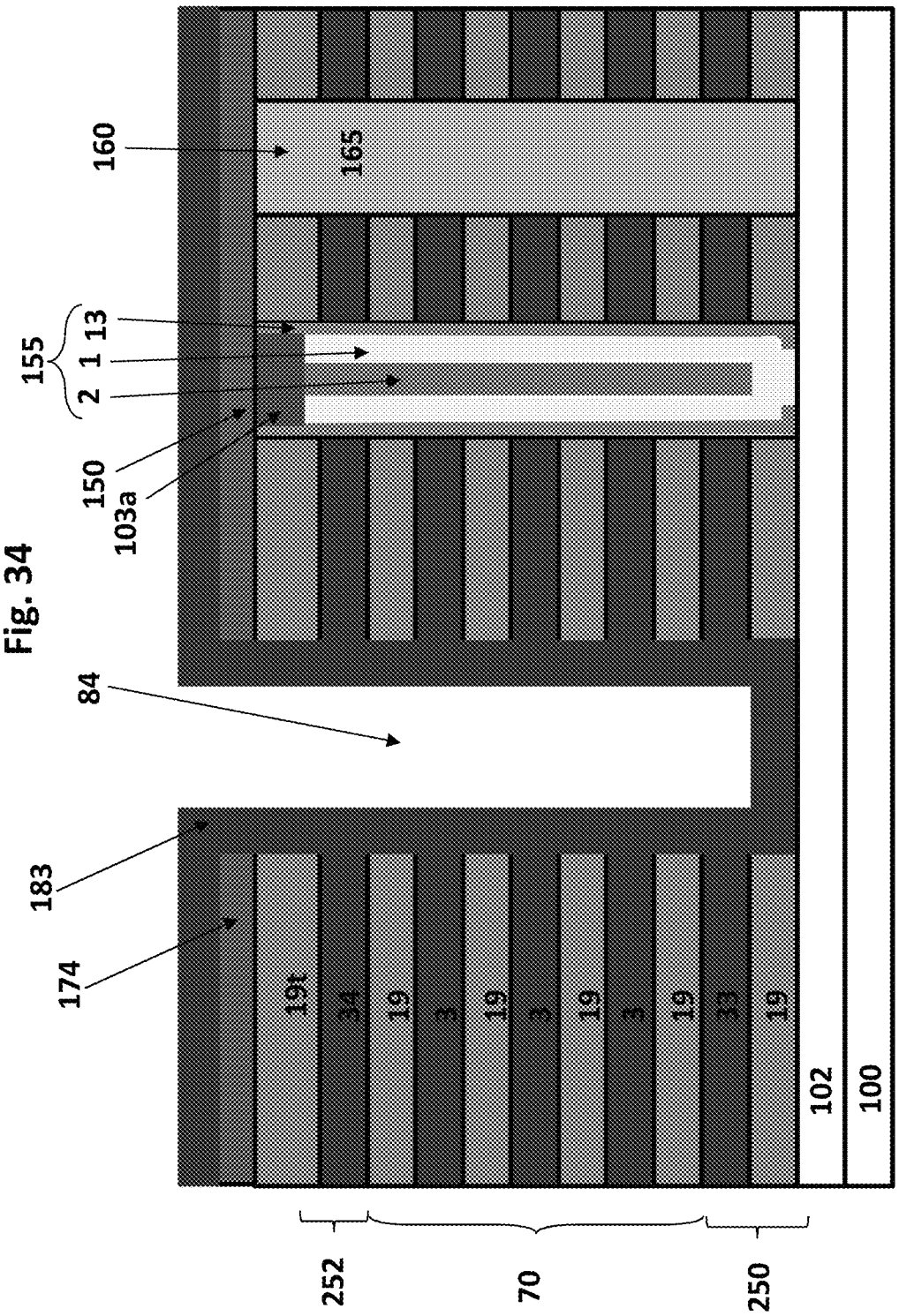
Figure 35:
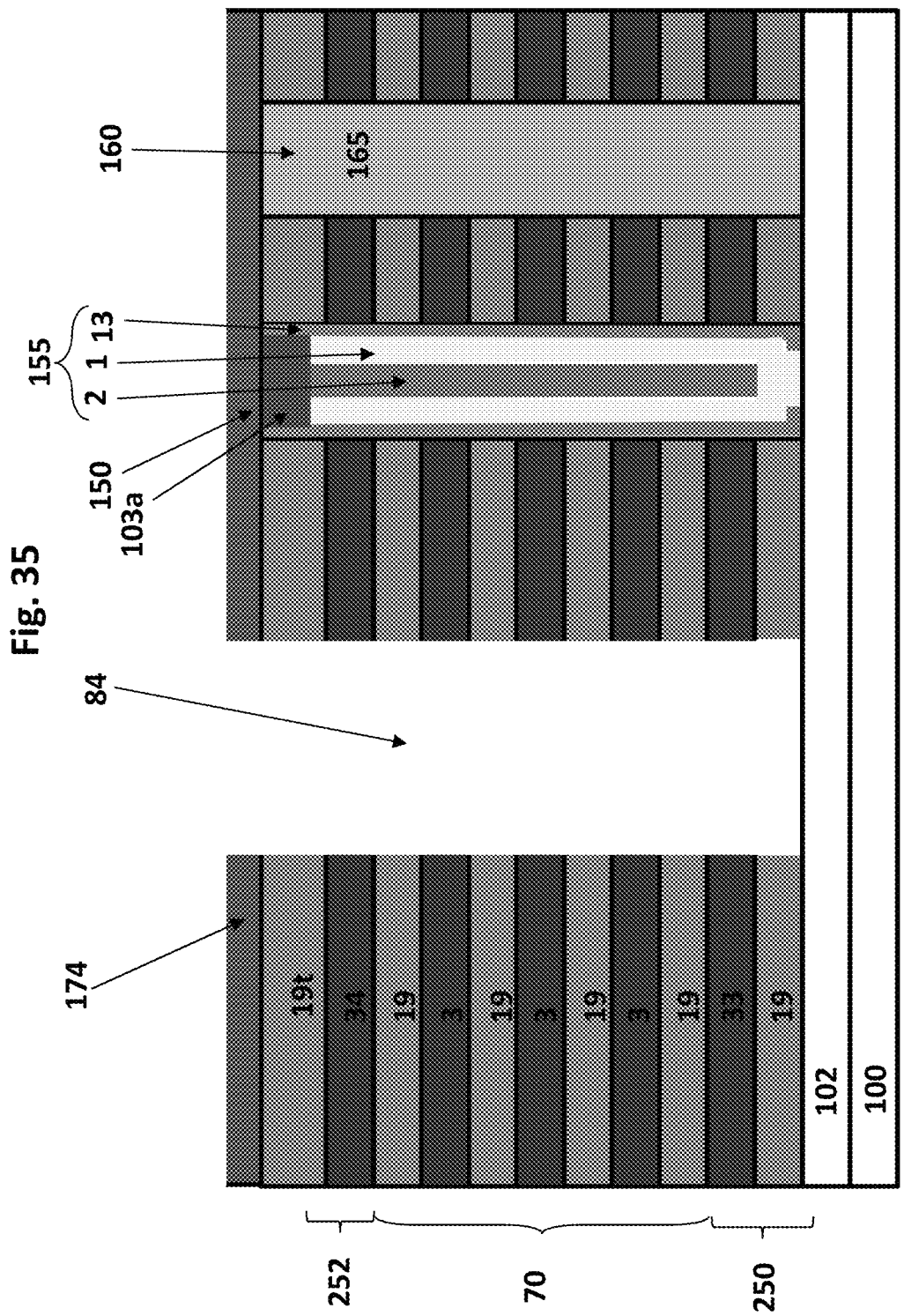

In some embodiments, as described in more detail below with respect to FIGS. 6-40, the plurality of control gate electrodes 3 is formed by first forming a plurality of sacrificial layers 121 as shown in FIGS. 7-32, then removing the plurality of sacrificial layers 121 and filling the resulting openings 182 with a conductive material to form a plurality of control gate electrodes 3, as shown in FIGS. 33-35. This fill step may result in warpage of the substrate 100 due to a compressive or tensile stress imposed by the plurality of control gate electrodes 3 on the substrate.

To counteract the compressive or tensile stress imposed by the plurality of control gate electrodes on the substrate, a plurality of dummy channels 160 in the dummy channel region 210 are filled with a dummy channel material 165 having a higher Young's modulus than a memory opening material 155 filling the monolithic three dimensional NAND strings 150 in the memory cell region 200. The Young's modulus of the memory opening material 155 is the overall Young's modulus of the combination of the memory film 13, the semiconductor channel 1, and optionally the insulating fill material 2. The dummy channel material 165 may be any suitable material having a higher Young's modulus than the memory opening material. The dummy channel material 165 may be an electrically insulating material, or an electrically insulating shell and an electrically conductive or semiconductor core, as will be describe below with reference to FIG. 24. When the dummy channel material 165 comprises a combination of materials, the overall Young's modulus of the combination of materials is higher than the Young's modulus of the memory opening material 155. The dummy channel material 165 may be silicon nitride, or a silicon oxide shell and a tungsten core.

In some embodiments, the control gate electrodes 3 are under one of compressive stress and tensile stress, and the dummy channel material 165 in the dummy channel 160 is under the other of compressive stress and tensile stress. In some embodiments, the control gate electrodes 3 are under tensile stress, and the dummy channel material is under compressive stress. However, in other embodiments, the control gates 3 and the dummy channel material 165 in the dummy channel 160 may be under the same type of compressive or tensile stress, or the dummy channel material 165 in the dummy channel 160 may be under no stress.

In some embodiments, the dummy channel region 210 is located under an electrode shunt 204, which is an area that may be less a less suitable location for monolithic three dimensional NAND strings 150.

In some embodiments, the area of the dummy channel region 210 comprises about 1 to about 15% of the total device area, such as from about 5 to about 10% of the total device area.

Figure 5:
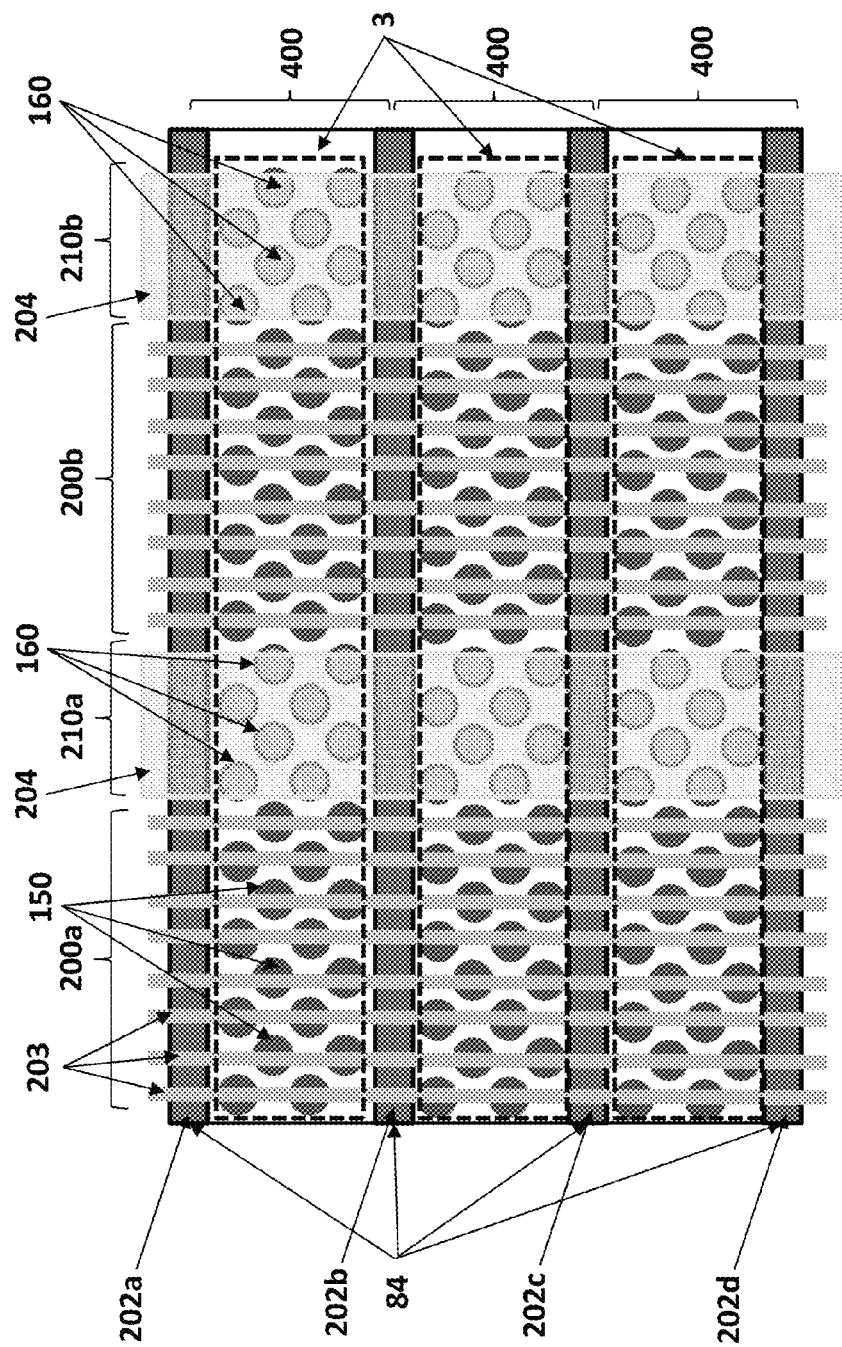
FIG. 5 is a schematic top view of a memory device containing plural memory blocks according to embodiments of the disclosure.

The device may include more than one memory cell region 200 and/or more than one dummy channel region 210. For example, FIG. 5 shows two memory cell regions 200a and 200b alternating with two dummy channel regions 210a and 210b. The memory cell regions 200a and 200b may have the same dimensions and the same number of three dimensional NAND strings 150, as shown in FIG. 5. Alternatively, the memory cell regions 200a and 200b may have different dimensions and/or a different number of three dimensional NAND strings 150. Similarly, the dummy channel regions 210a and 210b may have the same dimensions and the same number of dummy channels 160, as shown in FIG. 5. Alternatively, the dummy channel regions 210a and 210b may have different dimensions and/or a different number of dummy channels 160.

FIGS. 2A to 2C illustrate a memory block 400 containing an array of a plurality of vertical NAND strings 150 according to one embodiment of the disclosure. Each string includes memory device levels 70, respectively, as shown in FIG. 2C. FIGS. 2A and 2C show the location of memory region 200 and a stepped word line contact region 300.

Each NAND string 150 contains at least one memory film 13 which is located adjacent to the semiconductor channel 1 in the memory device levels 70, as shown in FIG. 2C. Specifically, the memory film 13 is located between the semiconductor channel 1 and the plurality of control gate electrodes 3. The memory film 13 contains a tunnel dielectric 11, a charge storage region(s) 9 (e.g., a dielectric charge trapping layer or floating gates), and a blocking dielectric 7.

Figure 3B:
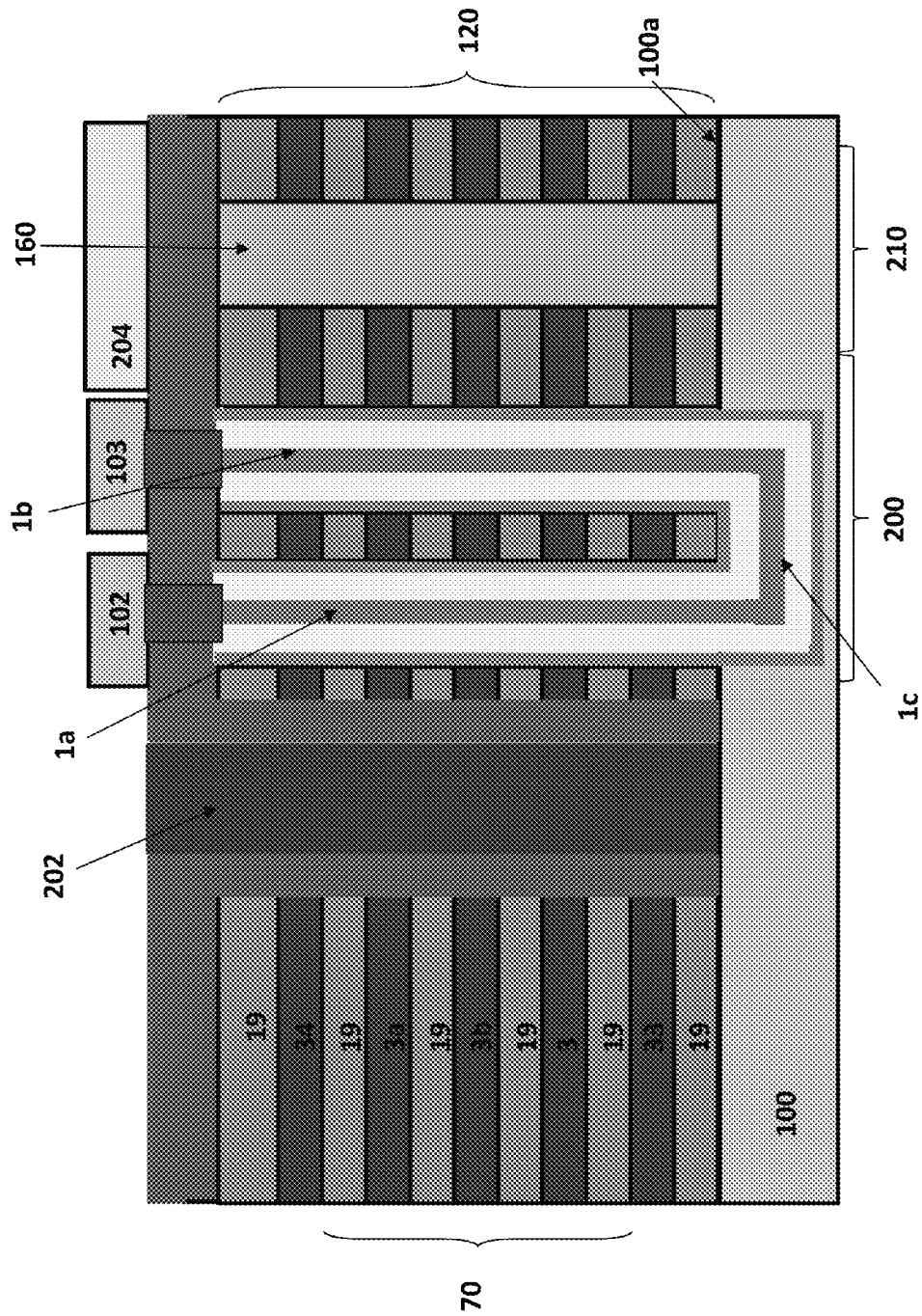
FIG. 3B is a side cross sectional view of a NAND string according to another alternative embodiment of the disclosure.

As shown in FIG. 2C, the memory device levels 70 include the semiconductor channel 1 having at least one end portion extending substantially perpendicular to a major surface 100a of a substrate 100, as shown in FIGS. 3A, 3B, 3C, 4A, and 4C. For example, the semiconductor channel 1 may have a pillar shape in the memory device levels 70 and the entire pillar-shaped semiconductor channel in the memory device levels 70 extends substantially perpendicularly to the major surface of the substrate 100, as shown in FIGS. 3A, 3C, 4A, and 4C. In some embodiments, the opposite end portions of the semiconductor channel 1 include semiconductor source and drain regions 102a, 103a doped with opposite conductivity type dopants (e.g., n-type) than that of the channel (e.g., p-type), as shown in FIG. 3A. The source and drain regions 102a, 103a electrically contact a respective source line and drain line. In one embodiment, the source/drain lines of the device can include a first line 102 formed under and a second line 103 formed over the semiconductor channel 1, as shown in FIGS. 3A, 4A, and 4C. In some embodiments, the first line 102 is a source line, and the second line 103 is a drain line. For example, a bottom portion 1b of the channel 1 contacts the source line 102, (if the source line 102 is a semiconductor of opposite conductivity type to that of the channel 1 and acts as a source region of the device) as shown in FIGS. 4A and 4C, and a drain region 103a in the upper portion of the channel 1 is electrically connected to the drain line 103, as shown in FIGS. 2B, 2C, 3A, 4A, and 4C.

Alternatively, the semiconductor channel 1 may have a U-shaped pipe shape, as shown in FIG. 3B. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes 102 contacts the first wing portion of the semiconductor channel from above, and another one of a source or drain electrodes 103 contacts the second wing portion of the semiconductor channel 1 from above.

Figure 3C:
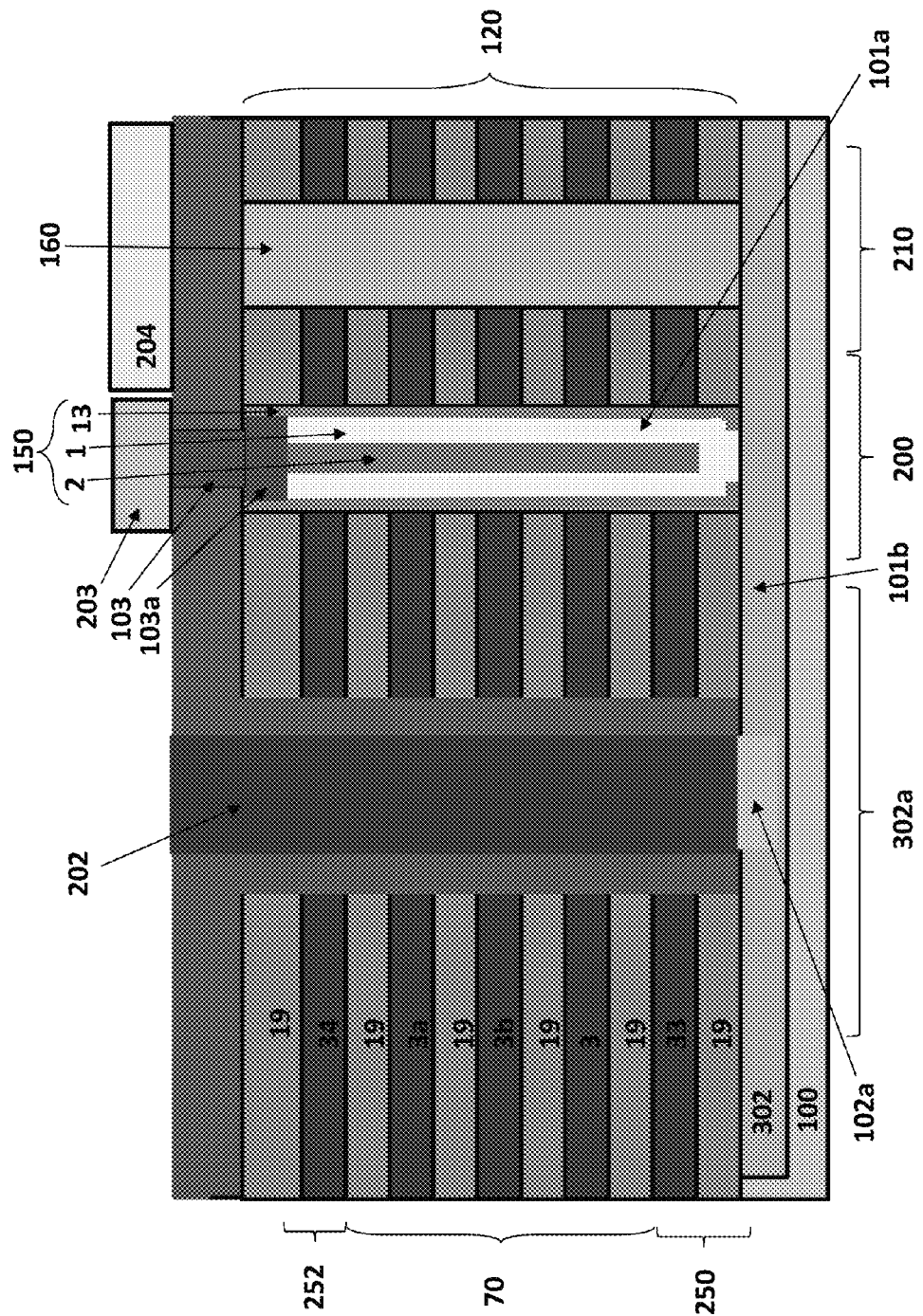
FIG. 3C is a side cross sectional view of a NAND string, dummy channel, and source electrode according to another alternative embodiment of the disclosure.

In an alternative embodiment shown in FIG. 3C, the semiconductor channel 1 may have a J-shaped pipe shape. A first wing portion 101a of the J-shaped pipe shape semiconductor channel 1 may extend substantially perpendicular to the major surface of the substrate 100, and a second horizontal portion 101b of the J-shaped pipe shape semiconductor channel extends substantially parallel to the major surface of the substrate 100. The device shown in FIG. 3C is similar to a side cross sectional view along line C-C' in FIG. 2A of device shown in FIGS. 2A-2C, except that the line 102 below the channel 1 of FIGS. 2A-2C is omitted in FIG. 3C. One of the source or drain electrodes (e.g., drain electrode 203) contacts the drain region 103a via the drain line 103 over the wing portion 101a of the semiconductor channel 1 from above, and another one of a source or drain electrodes (e.g., source electrode) 202 contacts the source region 102a next to the second portion 101b of the semiconductor channel from above. In these embodiments, a horizontal source line 102 of FIGS. 2B and 2C is not necessary. In some embodiments, the source electrode 202 is a rail shaped electrode located in a dielectric 205 insulated trench 84, and extends substantially parallel to the control gate electrodes 3, similar to that shown in FIGS. 2A and 2B. In some embodiments, the drain electrode is a line 203 located above the semiconductor channel 1, and the bit line extends substantially perpendicular to the plurality of control gate electrodes 3 and to the source electrode 202.

In some embodiments, the semiconductor channel 1 may be a filled feature, as shown in FIGS. 4C and 4D. In some other embodiments, the semiconductor channel 1 may be hollow, for example a hollow substantially cylindrical shape (e.g., tapered cylinder with increasing diameter, such as a hollow truncated cone, as shown in FIGS. 2B and 2C, or a cylinder with a substantially uniform diameter as a function of height throughout most of the channel, with the bottom portion 1b, as shown in FIGS. 4A and 4C) filled with the insulating fill material 2, as shown in FIGS. 4A and 4B. In these embodiments, an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The channels 1 are electrically connected to source line 102 having at least one end portion extending substantially parallel to the major surface 100a of the substrate 100, as shown in FIGS. 2B, 2C, 3A, 4A, and 4C. For example, the source line 102 may have a planar shape and the entire planar-shaped source line extends substantially parallel to the major surface of the substrate 100, as shown in FIGS. 2B, 2C, 4A, and 4C.

Alternatively, the source line 102 may be omitted, for example if a source electrode 202 contacts a source region 102a in or over the substrate 100, and a portion 101b of the semiconductor channel 1 extends parallel to the major surface of the substrate 100a in or over the substrate 100, such as in a semiconductor channel having a J-shaped pipe shape described above and illustrated in FIG. 3C.

In various embodiments, the semiconductor channel 1 comprises amorphous silicon or polysilicon having a first conductivity type (e.g., p-type), the source line 102 comprises single crystal silicon or polysilicon having a second conductivity type (e.g., n-type) and a higher doping concentration than the semiconductor channel 1, and the substrate 100 comprises a single crystal silicon substrate having a lower doping concentration than the source line 102. For example, the upper portion of the substrate 100 may include a well of the first conductivity type (e.g., p-well 302) below the source line 102, or in the absence of source line 102, as shown in FIG. 3C.

In some embodiments, at least the top major surface 100a of the substrate 100 comprises single crystal silicon. The entire substrate 100 may comprise a single crystal silicon substrate, such as a silicon wafer. Alternatively, the substrate may comprise a single crystal silicon layer which forms the top major surface 100a located over a silicon wafer or another supporting material.

The monolithic three dimensional NAND strings 150 in memory device levels 70 further comprise the plurality of control gate electrodes 3, as shown in FIGS. 2B, 2C, 3A, 3B, 3C, 4A, and 4C, which extend from the memory region 200 to the stepped word line contact region 300. The portions of the control gate electrodes 3 which extend into region 300 may be referred to as "word lines" herein. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride, alloys thereof or combination of these materials.

A blocking dielectric 7 is located adjacent to the control gate electrode(s) 3. In some embodiments, the blocking dielectric is located adjacent to the control gate electrode 3 and parallel to the channel 1, as shown in FIGS. 3A, 3B, 3C, 4A, and 4C. In other embodiments, the blocking dielectric 7 may surround the control gate electrode 3. The blocking dielectric 7 may comprise one or more layers having plurality of blocking dielectric segments located in contact with a respective one of the plurality of control gate electrodes 3. Alternatively, the blocking dielectric may comprise one or more continuous layers which extend the entire length of the memory cell portion of the NAND string.

The monolithic three dimensional NAND string 150 also comprise at least one charge storage region 9. The charge storage region 9 may comprise one or more continuous layers which extend the entire length of the memory cell portion of the NAND string. Alternatively, the charge storage region may comprise a plurality of discrete charge storage regions or segments 9 located between the blocking dielectric 7 and the channel 1.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the charge storage region 9 may comprise an insulating charge trapping material, such as a silicon nitride layer or silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1. The tunnel dielectric layer 11 may comprise a silicon oxide. For example, the tunnel dielectric layer 11 may be a silicon dioxide layer, or a silicon dioxide/silicon nitride/silicon dioxide multi-layer.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 may include multiple different layers, such as silicon oxide and metal oxide (e.g., $Al_2O_3$) layers. The tunnel dielectric 11 may include multiple layers of silicon oxide, silicon nitride and/or silicon oxynitride (e.g., ONO layers).

In one embodiment, the tunnel dielectric 11 comprises a silicon oxide layer which extends perpendicular to the major surface 100a of the substrate 100, and the charge trapping layer 9 comprises a silicon nitride layer which extends perpendicular to the major surface 100a of the substrate 100 and which contacts the tunnel dielectric 11. The blocking dielectric 7 comprises a first silicon oxide layer or a combination of silicon oxide and metal oxide layers which is patterned into regions which extend perpendicular to the major surface 100a of the substrate 100 and which contacts the charge trapping layer 9.

A plurality of drain electrodes (e.g., bit lines) 203 are located over the array of NAND strings 150 in each block 400, as shown in FIGS. 1, 2A, and 5. The drain electrodes 203 extend in the bit line direction B-B' from the first dielectric filled trench 84a to the second dielectric filled trench 84b in each block 400, as shown in FIG. 2A. Furthermore, as shown in FIG. 5, each trench 84 (except the end trenches in the device) extends in the word line direction and separates two adjacent blocks 400. The drain electrodes 203 extend over and perpendicular to the trenches over plural memory blocks 400. Each drain electrode 203 is electrically connected to an upper portion of a semiconductor channel 1 (e.g., to a doped drain region 103a over the channel 1) in one NAND string 150 in one memory opening 81 in each block via a drain line 103.

The density of the drain electrodes 203 depends on the number of rows of NAND strings 150 and on the spacing between adjacent NAND strings in each row, as shown in FIGS. 1, 2A, and 5. For example, as shown in FIGS. 2A and 5, each NAND string 150 has one drain electrode 203 passing over it. A respective drain line 103 connects the channel 1 in each NAND string 150 to the respective drain electrode 203 passing over the NAND string 150, as shown in FIGS. 2B, 2C, and 3A. In this case, the drain line 103 may be located over the middle of the NAND string 150.

In other embodiments, each memory opening 81 may have more than one drain electrode, for example two drain electrodes, passing over it. A respective drain line connects the channel in each NAND string to only one of the drain electrodes passing over the NAND string. In this case, the drain line may be located off center of the NAND string (e.g., closer to the periphery than to the middle), and the drain line contacts the channel at the periphery of the NAND string.

FIG. 2A illustrates a top view of a memory block 400. The memory block includes an array of NAND strings including at least one row of monolithic three dimensional NAND strings 150 described above, a first dielectric filled trench 84a located on a first side of the array, and a second dielectric filled trench 84b located on a second side of the array opposite to the first side of the array.

A first source electrode 202a is located in the first dielectric filled trench 84a and a second source electrode 202b is located in the second dielectric filled trench 84b in each block 400, as shown in FIGS. 2A and 2B. In the memory device levels 70, the dielectric fill in the trench 84 may comprise any suitable insulating layer 205, such as silicon oxide, etc., which is located on both walls of the trench 84. Each source electrode 202 is located in the middle of the trench 84 and is separated from the control gate electrodes 3 by the insulating layer 205, as shown in FIG. 2B. The source electrode 202 contacts the source line 102, as shown in FIG. 2B, or the source 102a in the p-well 302, as shown in FIG. 3C.

The electrode shunt 204 extends substantially parallel to the major surface 100a of the substrate 100 and electrically connects multiple source electrodes 202, for example source electrodes 202a, 202b, 202c, and 202d shown in FIG. 5. The electrode shunt 204 comprises any suitable conductive materials known in the art.

The array NAND strings may include any number of rows of NAND strings 150. For example, the array shown in FIG. 2A comprises at least a 4×1, such as at least a 4×3, array of NAND strings. In other words, the array shown in these figures has four rows of NAND strings, and there is at least one NAND string in each row. The rows of NAND strings extend in the word line direction (e.g., along line W-W' in FIG. 2A). Thus, the array in the block 400 comprises first, second, third and fourth rows of NAND strings 150 extending in the word line direction. As shown in FIG. 2A, the semiconductor channels in the first and the third rows of NAND strings are offset from respective semiconductor channels in the second and fourth rows of NAND strings along the word line direction. In general, the semiconductor channels in the odd numbered rows of NAND strings are offset from respective semiconductor channels in the even numbered rows of NAND strings along the word line direction. Alternatively, semiconductor channels in adjacent rows may be aligned.

In alternative embodiments, each memory block 400 may have an array with fewer than 4 rows of NAND strings. Alternatively, the array in each block may have more than 4 rows, such as 5 to 20 rows of NAND strings. FIG. 5 shows a plurality of 4×4 arrays of NAND strings, where each array has four rows of NAND strings, and each row contains 4 NAND strings.

As shown in FIG. 2B, the first semiconductor channel 1 in each of the first and the second rows of NAND strings 150 comprises a bottom side 1b which contacts the first source line 102, which in turn contacts the first source electrode 202a (e.g., the left side source electrode in FIG. 2B which corresponds to the source electrode positioned in the "upper" trench 84a in FIG. 2A) and the second source electrode 202b (e.g., the right side source electrode in FIG. 2B which corresponds to the source electrode positioned in the "lower" trench 84b in FIG. 2A).

As shown in FIG. 2C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

The memory block 400 contains a common control gate electrode 3 in each of the plurality of memory device levels 70 for the first, second, third and fourth rows of NAND strings shown in FIGS. 2B and 2C. The common control gate electrode 3 may also be referred to as a wordline or a wordline finger (shown as dashed lines in FIG. 5). In various embodiments, the memory block 400 optionally includes a select gate electrode 33 (e.g., source side select gate electrode 33 shown in FIG. 3A) located between the conductive source line 102 and the control gate electrodes 3, and the select gate electrode is continuous in the array. The memory block 400 may optionally include a drain side select gate electrode 34 located over the control gate electrodes 3, shown in FIG. 3A, and the drain side select gate electrode is continuous in the array. In various embodiments, the source electrode 202 contacts a common source line 102, or, if the source line 102 is omitted, the source region 102a in the substrate 100 or the p-well 302, as shown in FIG. 3C, for the first second, third and fourth rows of NAND strings in the block 400. Therefore, all of the NAND strings in the array in each block 400 can be erased together in the same erase step, as shown in FIGS. 2B and 5. For example, one specific memory cell can be selected by selecting (i.e., applying a current or voltage) to one source electrode 202, one bit line (i.e., drain electrode) 203 and one word line (e.g., control gate electrode) 3. Specifically, a particular block 400 is selected with the common source electrode 202 in that block, the specific memory opening 81/NAND string 150 is selected with the bit line (drain electrode) 203, and the particular cell in one memory device level 70 in the NAND string 150 is selected with the word line 3. In various embodiments, the memory block 400 may include a source side select transistor 250 (containing the source side select gate electrode 33 and adjacent portions of the channel and memory film as shown in FIG. 3A) located between the conductive source line and the plurality of control gate electrodes 3. In various embodiments, the memory block 400 may include a drain side select transistor 252 (containing the drain side select gate electrode 34 and adjacent portions of the channel and memory film as shown in FIG. 3A) located over the NAND memory cell region (i.e., over the memory device levels 70 in region 200 and below the doped drain region 103a).

In some embodiments, the source line 102 is a semiconductor material, for example n-type polysilicon, and the NAND string may be erased by a process referred to herein as "well erase." A voltage, such as a positive is applied to the semiconductor source line 102 via the source electrode 202, and a different voltage is applied to the drain electrode to create a potential difference between the source line (more positive) and the drain electrode (more negative). This causes a depletion region (fully or partially) to form in the semiconductor source line adjacent to the channel due to the migration of electrons out of the depletion region toward the source electrode 202 and thus holes get accumulated. The resulting holes then migrate from the depletion region into the channel silicon to recombine with the trapped electrons in the charge storage regions 9 and thus erase the NAND string (or selected cells in the string). Alternatively, if the n-type and p-type regions are reversed, then the charge carrier types and voltages should also be reversed. In another embodiment, the source line 102 is biased to erase voltage (positive) and the source electrode 202 is floating or at ground voltage and drain electrode is floating or at ground voltage for well erase.

In other embodiments, the source line 102 is a metal or metal alloy (e.g., metal nitride or silicide), and the NAND string may be erased by a process referred to herein as a "gate-induced drain leakage" ("GIDL") erase. A positive voltage is applied to the conductive source line 102, and a different, less positive voltage (e.g., negative or smaller positive voltage) is applied to the drain electrode 203. In some embodiments, the drain electrode 203 is grounded instead. Electrons and holes are separated at an n-p junction between the n-type source region and the p-type channel 1. The holes can migrate away from the positive voltage at the source region into the channel to recombine with the trapped electrons in the charge storage regions 9 and erase the NAND string (or selected cells in the string). Alternatively, if the n-type and p-type regions are reversed, then the charge carrier types and voltages should also be reversed.

In other embodiments, the source line 102 is a semiconductor material, for example n-type polysilicon, and the NAND string may be erased by the GIDL erase process. In this case, the bottom most conductive word line is biased to a less positive voltage and source line 102 is biased to an erase voltage to make sufficient potential difference to generate GIDL holes. The drain electrode is floating or grounded instead. The GIDL holes can migrate away from the positive voltage of the bottom most conductive word line electrode into the channel to recombine with the trapped electrons in the charge storage regions 9 and erase the NAND string (or selected cells in the string).

As described above, in various embodiments, the semiconductor channel 1 may be a solid rod shape or a hollow substantially cylindrical shape in the memory device levels 70. The tunnel dielectric 11 comprises a cylinder or inverse truncated cone which surrounds the semiconductor channel 1. The charge storage region 9 comprises a cylinder or inverse truncated cone which surrounds the tunnel dielectric 11. The blocking dielectric 7 comprises a cylinder or inverse truncated cone which surrounds the charge storage region 9. The plurality of control gate electrodes 3 comprise metal or metal alloy control gate electrodes which surround the blocking dielectric 7 in each NAND string 150.

FIGS. 6 to 40 illustrate a method of making a NAND device having dummy holes according to a non-limiting embodiment of the disclosure. Specifically, the method results in lower wafer warpage due to the mechanical stress imposed by the plurality of control gate electrodes on the substrate.

Specifically, in the prior art method, the control gate electrodes are formed by first forming a stack of sacrificial layers separated by insulating layers. The sacrificial layers are removed and the resulting space is filled with a conductive material, for example tungsten. However, this fill method results in mechanical stress imposed on the substrate. Although high temperature annealing can alleviate some of the stress, high temperatures are not acceptable for some devices, for example devices including CMOS technology.

In contrast, as will be explained in more detail with reference to FIGS. 6-40, in the embodiment methods of the present disclosure, a stack 120 of alternating layers of a first material and a second material is deposited over a major surface 100a of a substrate 100, and a plurality of memory openings 81 and a plurality of dummy openings 82 are subsequently etched in the stack 120. The memory opening 81 and dummy openings 82 extend substantially perpendicular to the major surface of the substrate. The memory opening 81 is filled with a memory opening material 155 including a semiconductor channel 1 and a memory film 13 including a charge storage region, a tunnel dielectric, and a blocking dielectric. The dummy opening 82 is filled with a dummy material 165 that has a higher Young's modulus than the memory opening material 155.

Figure 6:
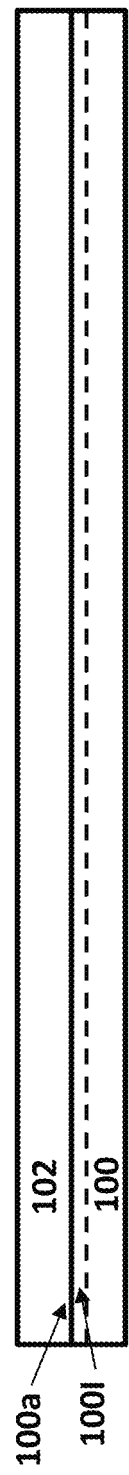
FIGS. 6-23 and 29-40 are side cross sectional views illustrating steps in an embodiment method of making the device illustrated in FIGS. 1 and 2A-2C along line C-C' in FIG. 2A.

FIGS. 6-40 illustrate a method of making the NAND device. FIG. 6 illustrates a first step in the embodiment method of making the NAND device. FIG. 6 shows an optional conductive source line 102 formed substantially parallel to a major surface 100a of a substrate 100. In various embodiments, the substrate is single crystal silicon, optionally doped with a first conductivity type (e.g., n or p-type, such as containing the p-well 302 shown in FIG. 3C) at a concentration of less than $10^{18}$ cm$^3$, for example from $10^{15}$-$10^{17}$ cm$^3$. In various embodiments, the conductive source line 102 comprises a doped upper portion of the substrate 100 or a deposited semiconductor layer having a higher doping concentration than the substrate. In some embodiments, the conductive source line 102 is polysilicon or single crystal silicon doped with a second conductivity type (e.g., p or n-type opposite to that of the substrate) at a concentration of at least $10^{18}$ cm$^3$. Alternatively, the source line 102 can be omitted, as shown in FIG. 3C.

In some embodiments, an optional insulating layer (e.g., silicon oxide, etc.) 100I is formed directly on or over the substrate 100 (e.g., a silicon substrate), and the optional conductive source line 102 is formed directly on or over the insulating layer. In these embodiments, the NAND strings are formed on the resulting silicon on insulator (SOI) substrate.

In some embodiments, the polysilicon conductive source line 102 is formed by depositing a small grain polysilicon or amorphous silicon layer followed by annealing the layer (e.g., a laser anneal, a thermal anneal, and/or a lamp anneal) to recrystallize the layer to form a larger grained polysilicon layer. For example, the recrystallized source line 102 may be formed on the insulating layer 100I of the SOI substrate.

Figure 7:
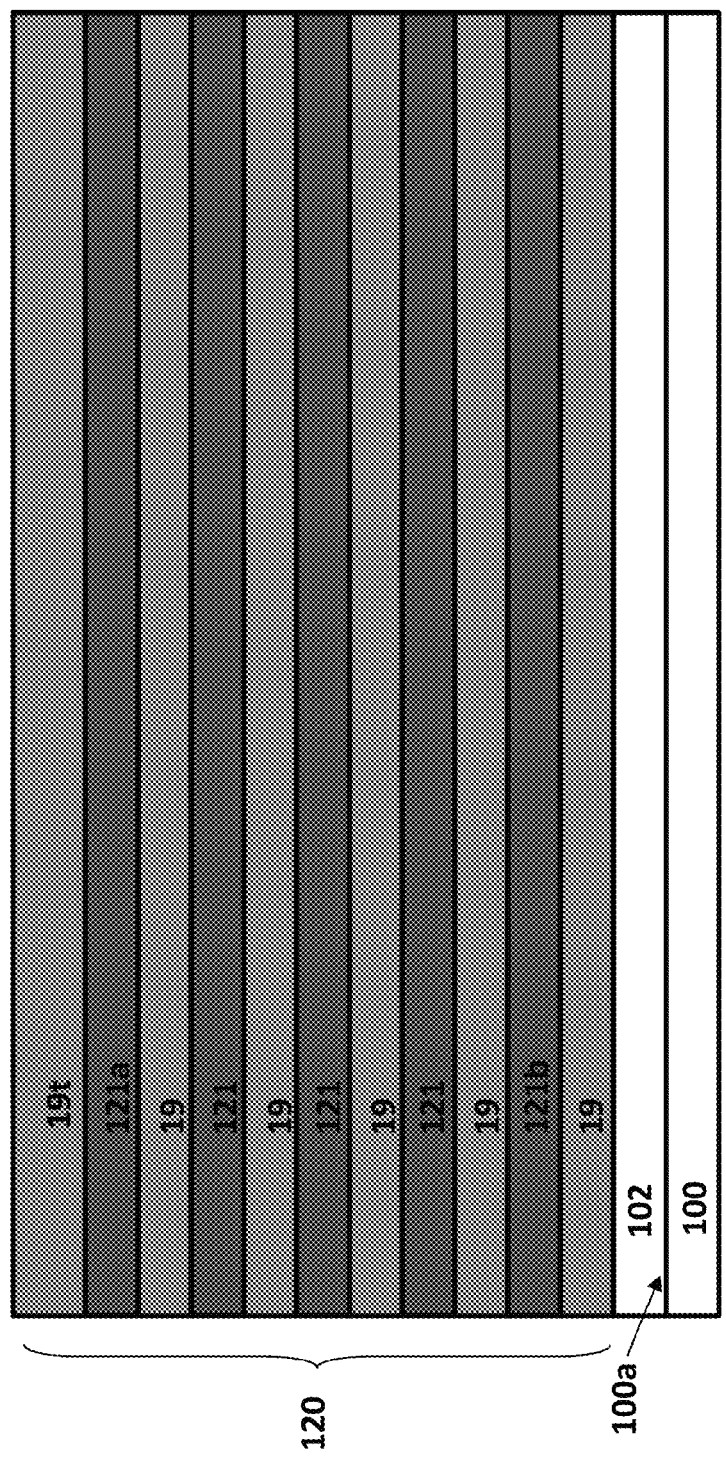

As shown in FIG. 7, a stack 120 of alternating layers 19 and 121 are formed over the source line 102. Layers 19, 121 may be deposited by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. In some embodiments, layers 121 comprise silicon nitride.

Figure 8:
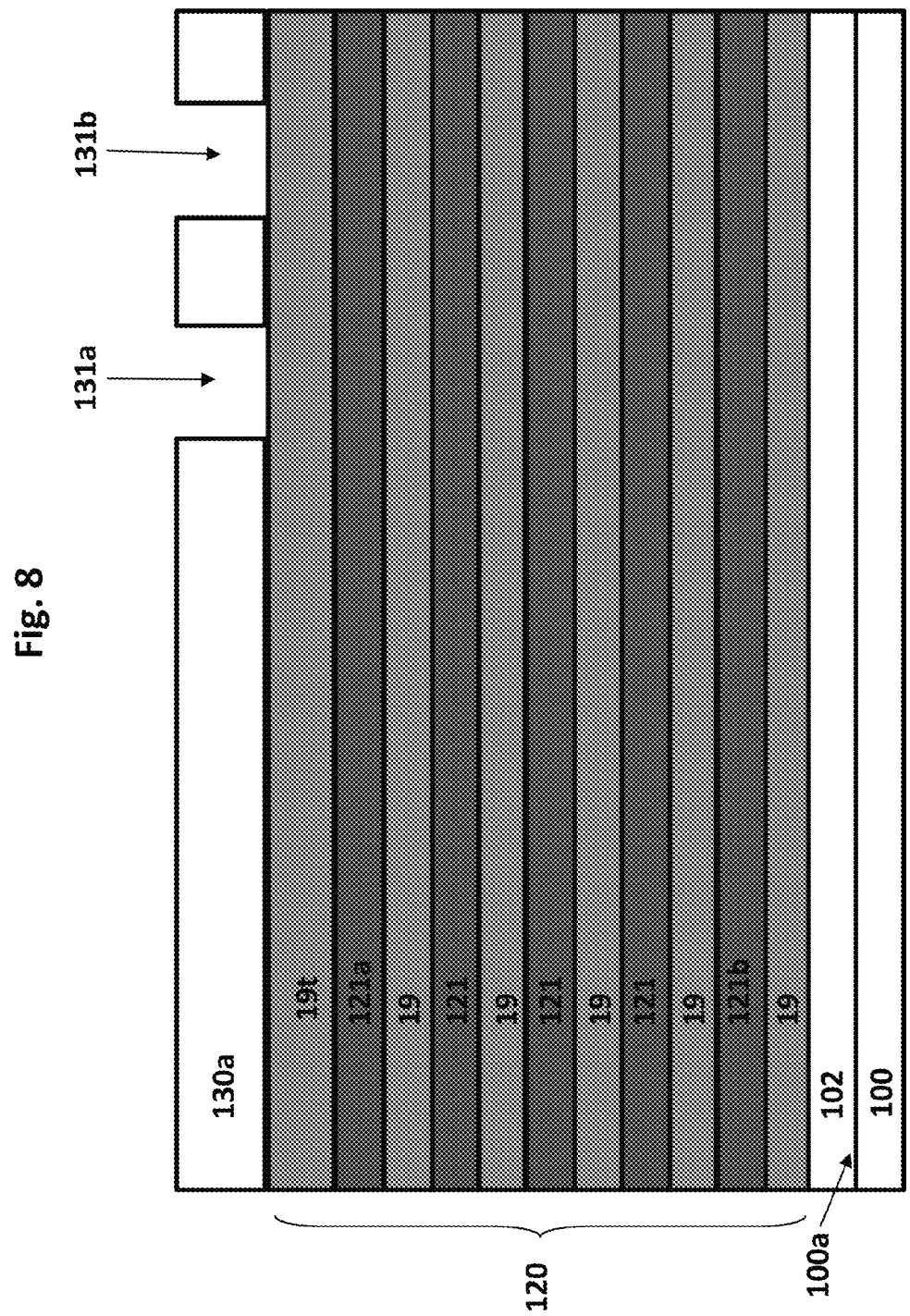
Figure 9:
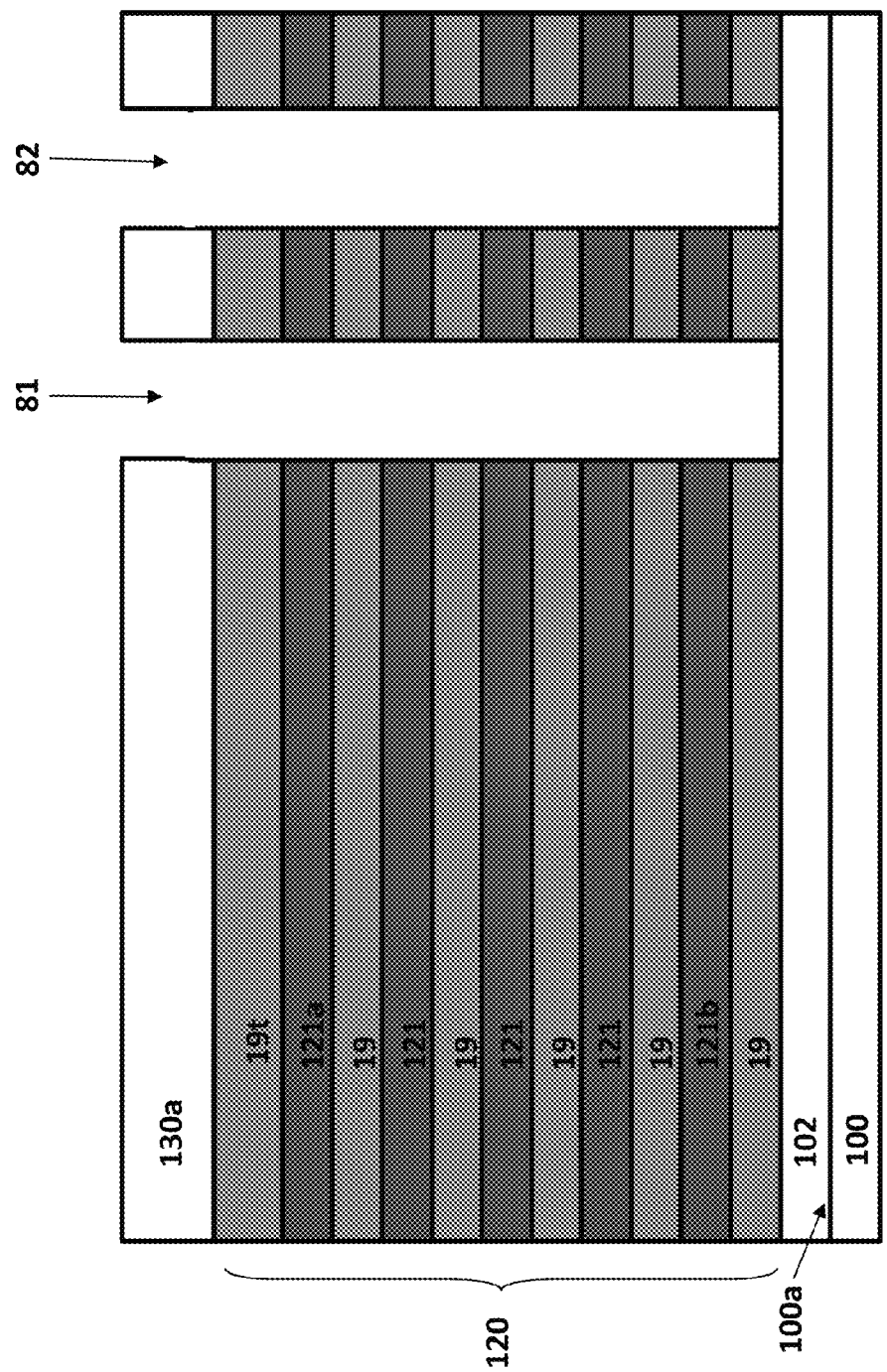

The deposition of layers 19, 121, is followed by etching the stack 120 to form at least one a front side opening 81 in the stack 120. An array of a memory openings 81 (e.g., cylindrical memory openings or holes) may be formed in locations where vertical channels of NAND strings 150 will be subsequently formed, as shown in FIGS. 8 and 9. An array of dummy openings 82 may be formed in locations where NAND strings 150 will not be formed, for example under an electrode shunt 204, as shown in FIGS. 8 and 9. The memory openings 81 and the dummy openings 82 may have circular cross sections when viewed from above. The memory openings 81 may have the same size and/or shape as the dummy openings 82, or they may have a different size and/or shape from the dummy openings. For the sake of clarity, one memory opening 81 and one dummy opening 82 are shown in FIGS. 8 to 16.

The memory openings 81 and dummy openings 82 may be formed by photolithography and etching, as follows. First, a memory opening mask 130a is formed over the top layer 19t of the stack and patterned to form mask openings 131a and 131b exposing the stack 120, as shown in FIG. 8. Mask 130a may comprise any suitable material, such as one or more layer of photoresist and/or hard mask material. Then, the stack 120 is etched using RIE to form the memory opening 81 in the stack through the mask opening 131a in mask 130, and to form the dummy opening 82 in the stack through the mask opening 131b. Mask openings 131a and 131b may be the same size and shape, or they may be a different size and/or a different shape. Each front side memory opening 81 is etched until the source line 102 (or the substrate 100 or p-well 302 if the source line 102 is omitted) is exposed in the opening 81, as shown in FIG. 9. The dummy opening 82 may be etched until the source line 102 (or the substrate 100 or p-well 302 if the source line 102 is omitted) is exposed, making the dummy opening 82 substantially the same height as the memory opening 81, as shown in FIG. 9. In an alternative embodiment, the dummy opening 82 is shorter or longer than the memory opening 81.

Figure 10:
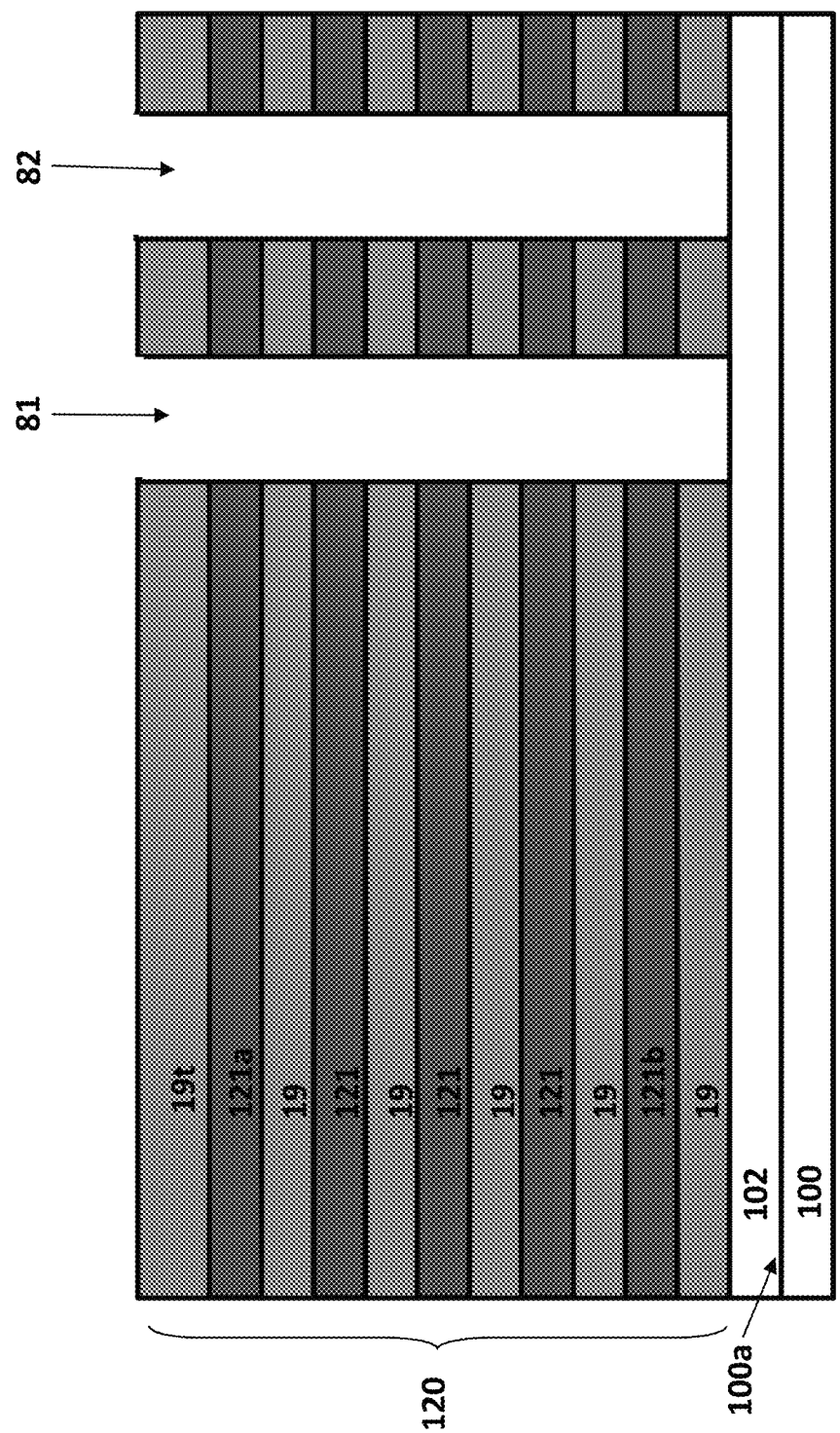

The mask 130a is then removed, as shown in FIG. 10.

Figure 11:
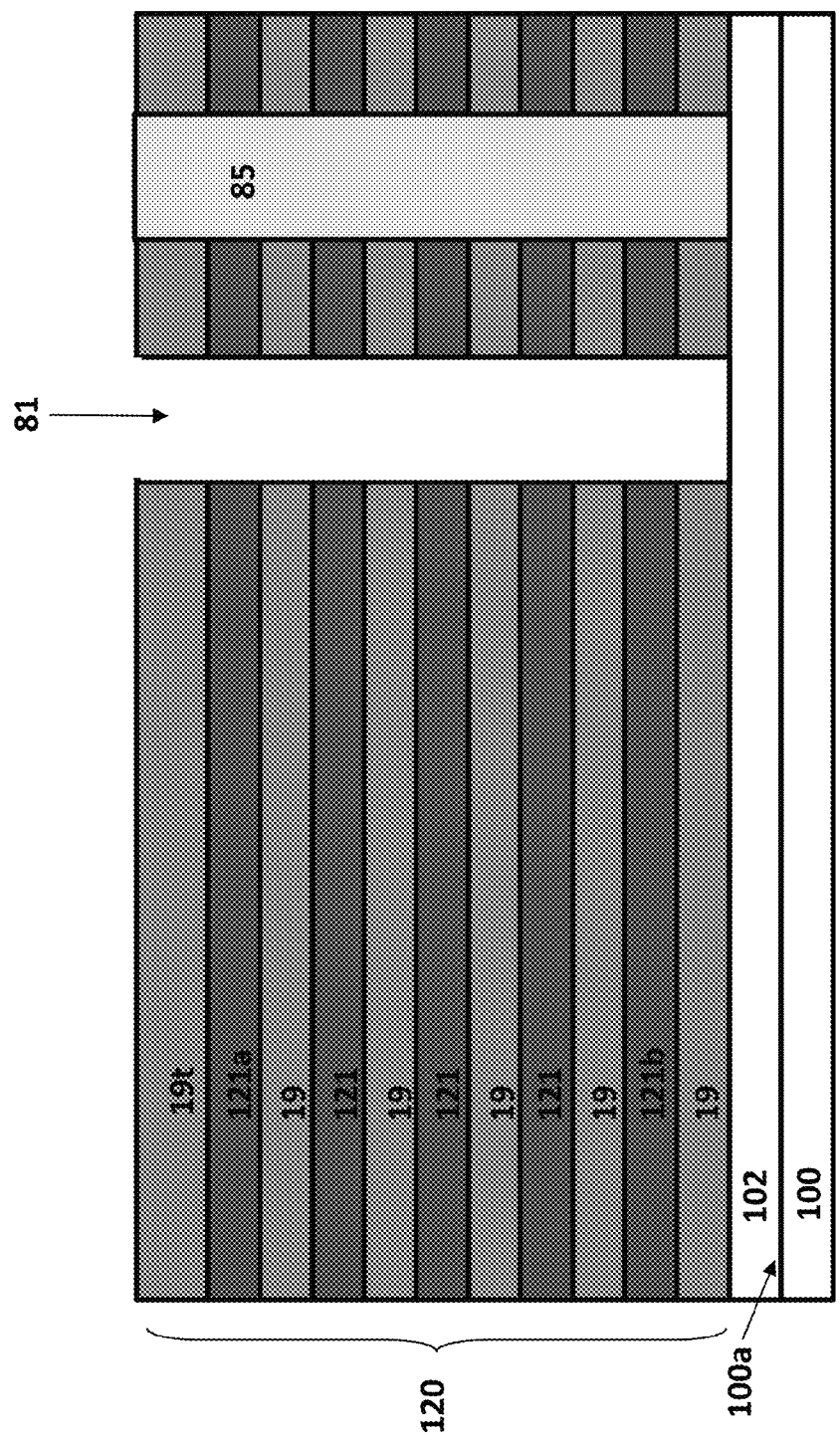

As shown in FIG. 11, a cover layer 85 is formed over a portion of the top layer 19t of the stack and optionally in the dummy opening 82. Cover layer 85 may comprise any suitable material, such as an amorphous carbon layer, an amorphous silicon or polysilicon layer, or a silicon oxide layer. Cover layer 85 may be deposited as an air bridge over the top of dummy opening 82, or it may fill part of the dummy opening 82 or the entire dummy opening 82, as shown in FIG. 11. Portions of the cover layer 85 may be planarized even with the stack 120 to remove portions of layer 85 located over a portion of the top layer 19t of the stack. Cover layer 85 protects the dummy opening 82 from deposition of memory opening material during subsequent processing steps.

Figure 12:
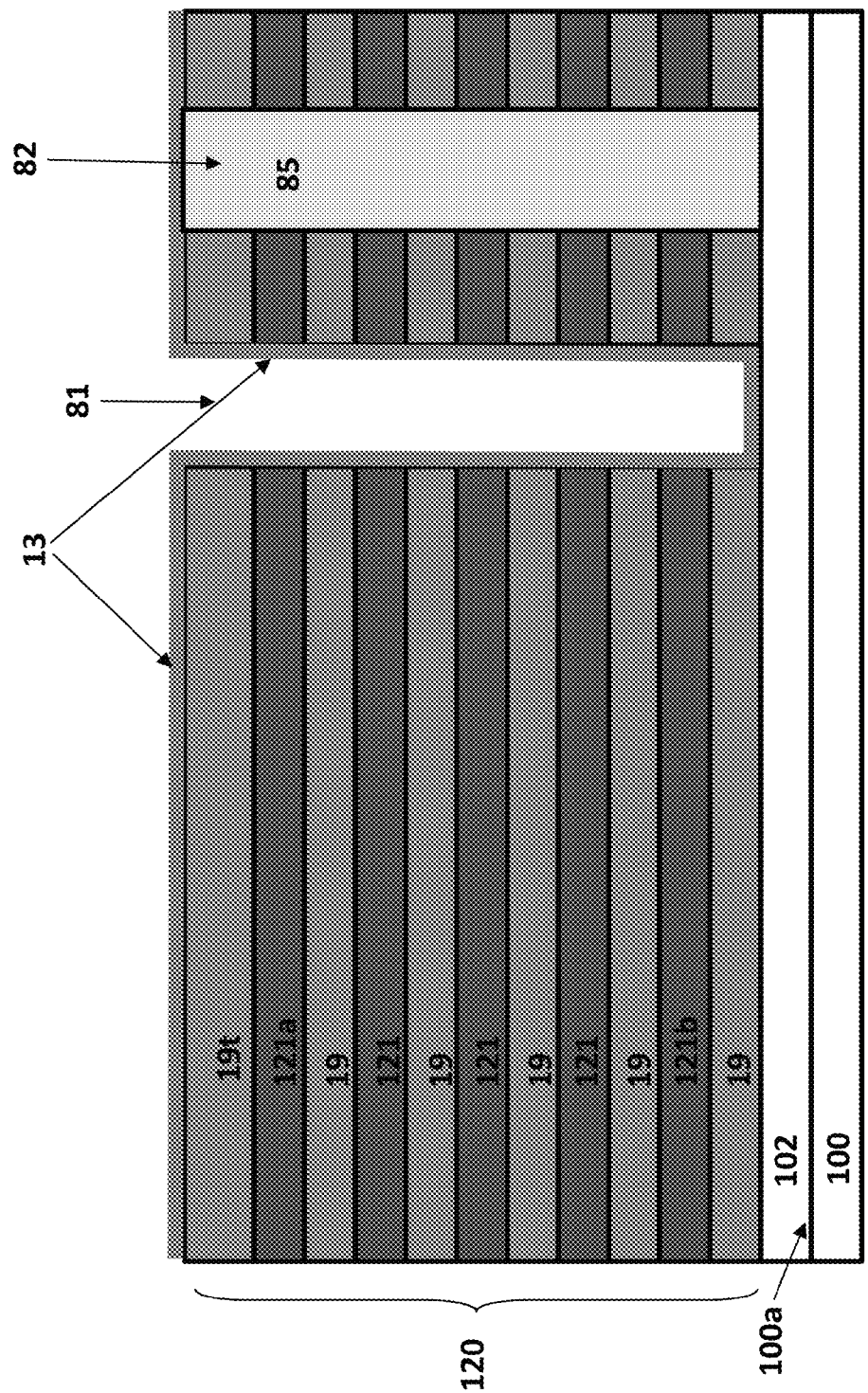

Then, as shown in FIG. 12, the memory film 13 is formed in the memory opening 81 and over the stack 120 and cover layer 85. Specifically, this step optionally includes forming a blocking dielectric in the memory opening 81, forming a charge storage region (e.g., silicon nitride layer or a floating gate layer) over the optional blocking dielectric in the memory opening, and forming a tunneling dielectric over the charge storage region in the memory opening 81. Alternatively, the blocking dielectric is formed from the back side at a later step in the process.

Then, the channel 1 is formed by depositing channel material, such as a lightly doped or intrinsic polysilicon over the tunnel dielectric layer portion of the memory film 13 in the memory opening 81. In some embodiments, a high temperature anneal may be performed after forming the channel 1. As discussed above, the entire memory opening 81 may be filled to form the device illustrated in FIG. 4D. Alternatively, a layer of channel material may first be deposited in the memory opening 81 followed by deposition of an insulating fill material 2 to form the device illustrated in FIG. 4B.

Figure 13:
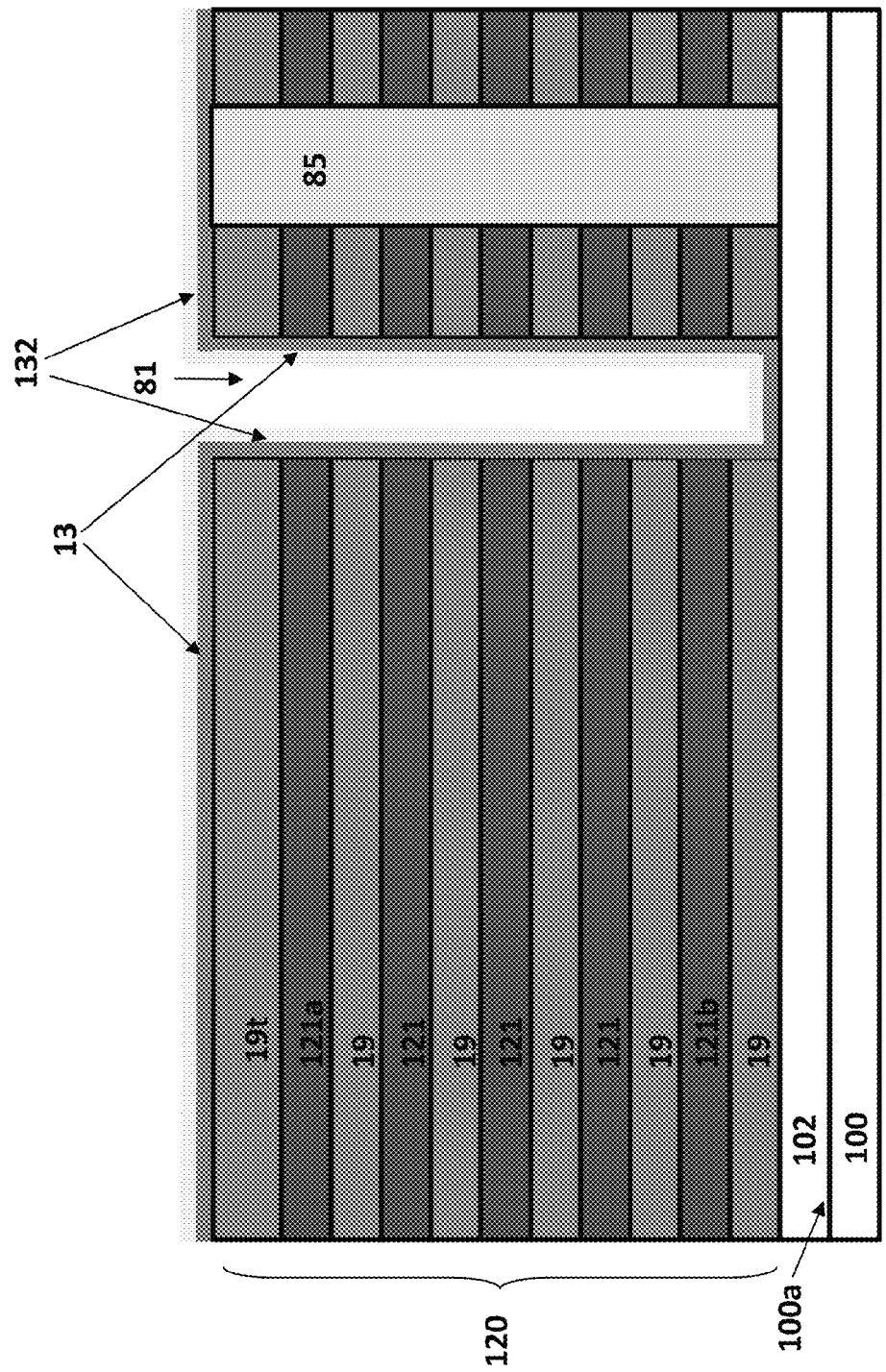

In some embodiments, the channel may be formed by a multi-step process utilizing a protective layer, as will be described below with reference to FIGS. 13 to 21. First, as shown in FIG. 13, a cover semiconductor layer 132, such as an amorphous silicon or polysilicon layer, is formed in the memory opening 81 over the memory film 13 and over the stack 120. Layer 132 protects the memory film 13 from damage during a subsequent etching step.

Figure 14:
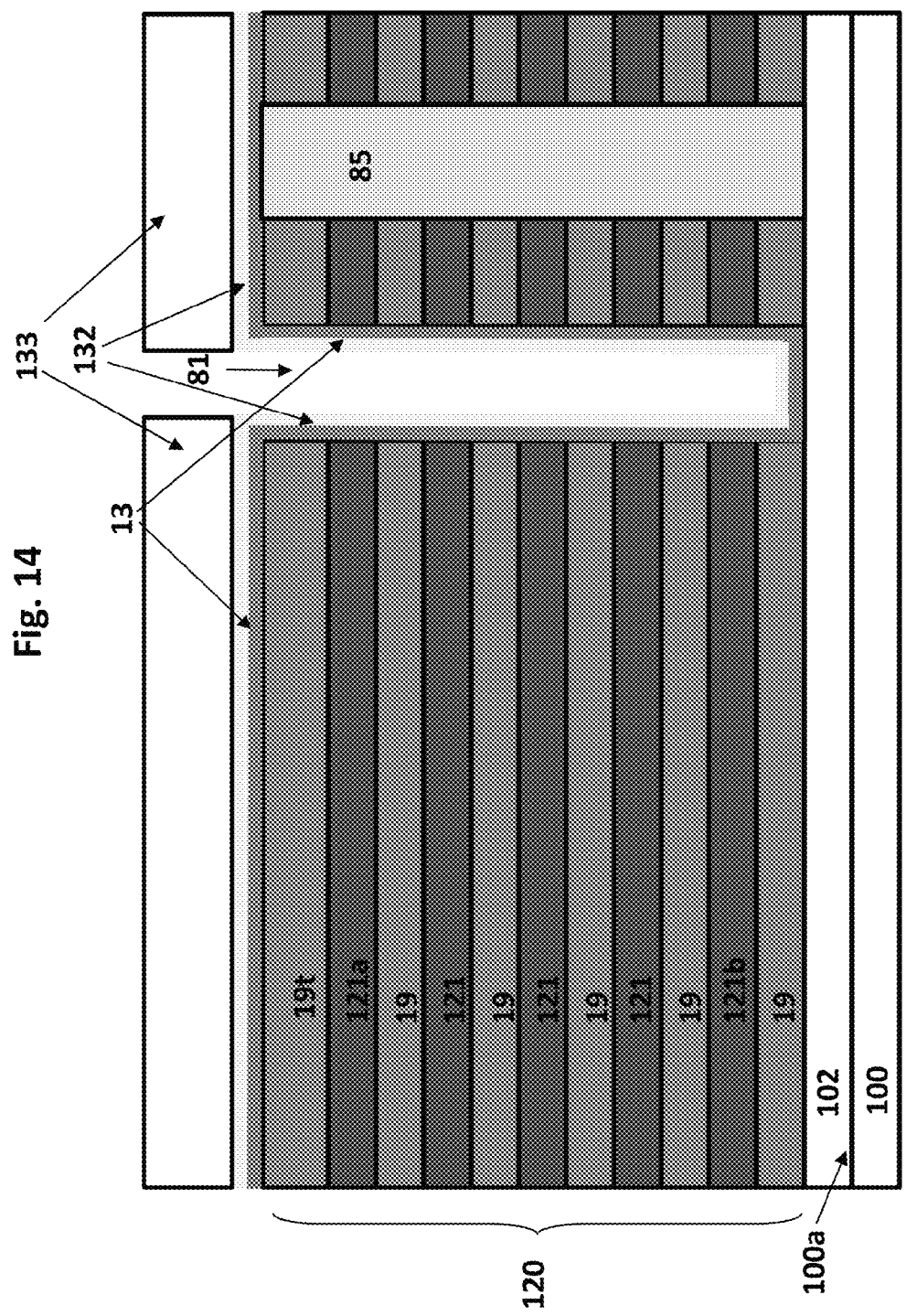

Then, a hard mask cover layer 133 is formed over layer 132. The hard mask cover layer 133 may comprise an amorphous carbon layer for example. Layer 133 is deposited non-conformally such that layer 133 is located over layer 132 on top of the stack 120, but does not extend into the memory opening 81, as shown in FIG. 14. Alternatively, layer 133 may be deposited conformally and then patterned by photolithography and etching to be removed from the memory opening 81.

Figure 15:
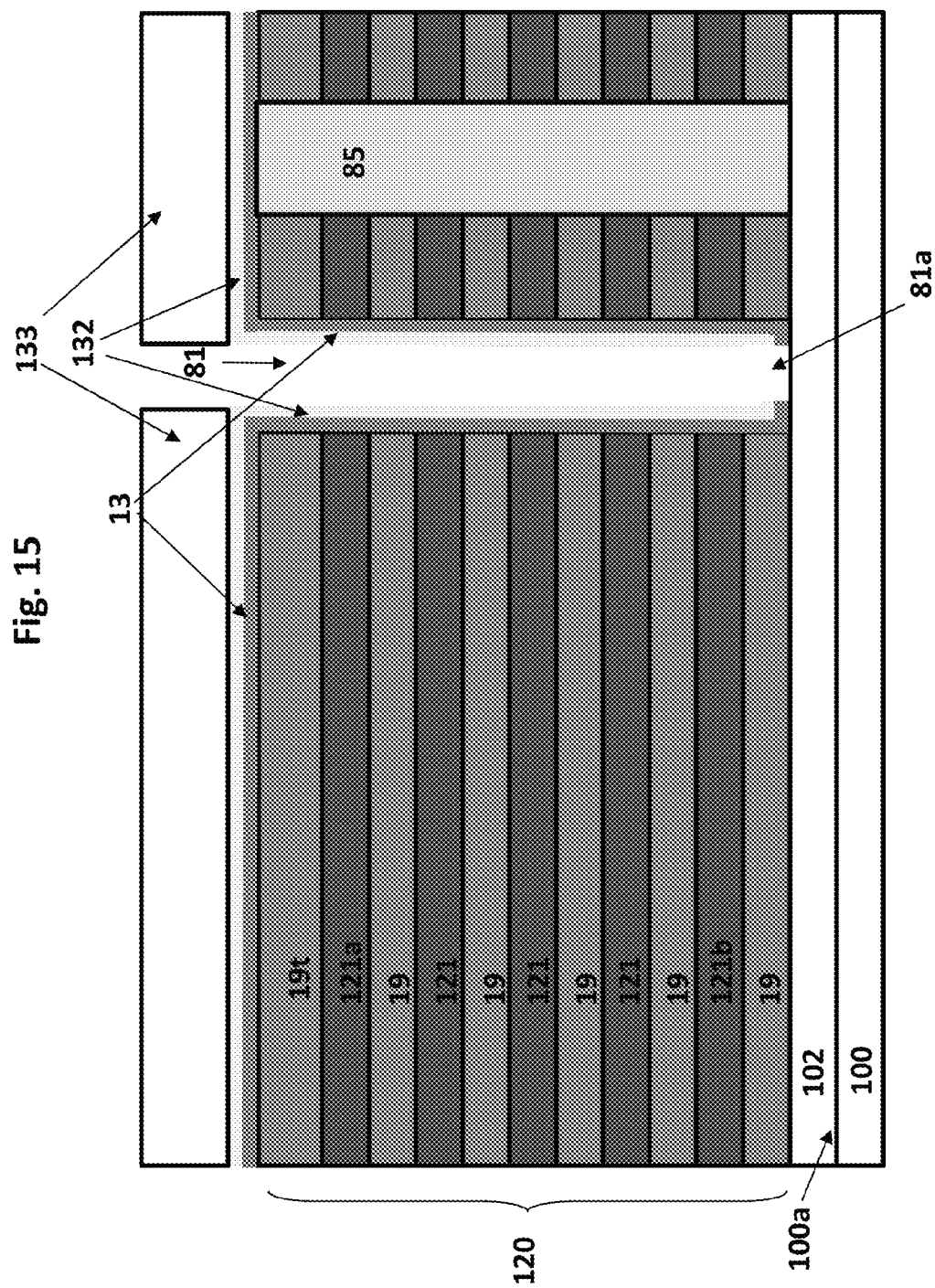

As shown in FIG. 15, the memory film 13 (e.g., the blocking dielectric, the charge storage region and the tunnel dielectric) and cover semiconductor layer 132 are removed from a bottom of the memory opening 81 using RIE or another suitable anisotropic etching method. The cover semiconductor layer 132 protects the memory film 13 on the sidewalls of the memory opening 81 from etching damage, and the hard mask cover layer 133 protects the rest of the stack from being etched. The etching step forms extension portions 81A of the openings 81 which expose the source line 102, substrate 100, or p-well 302 at the bottom of the memory opening 81. The hard mask cover layer 133 is then removed by any suitable method, such as ashing or selective wet etching.

Figure 16:
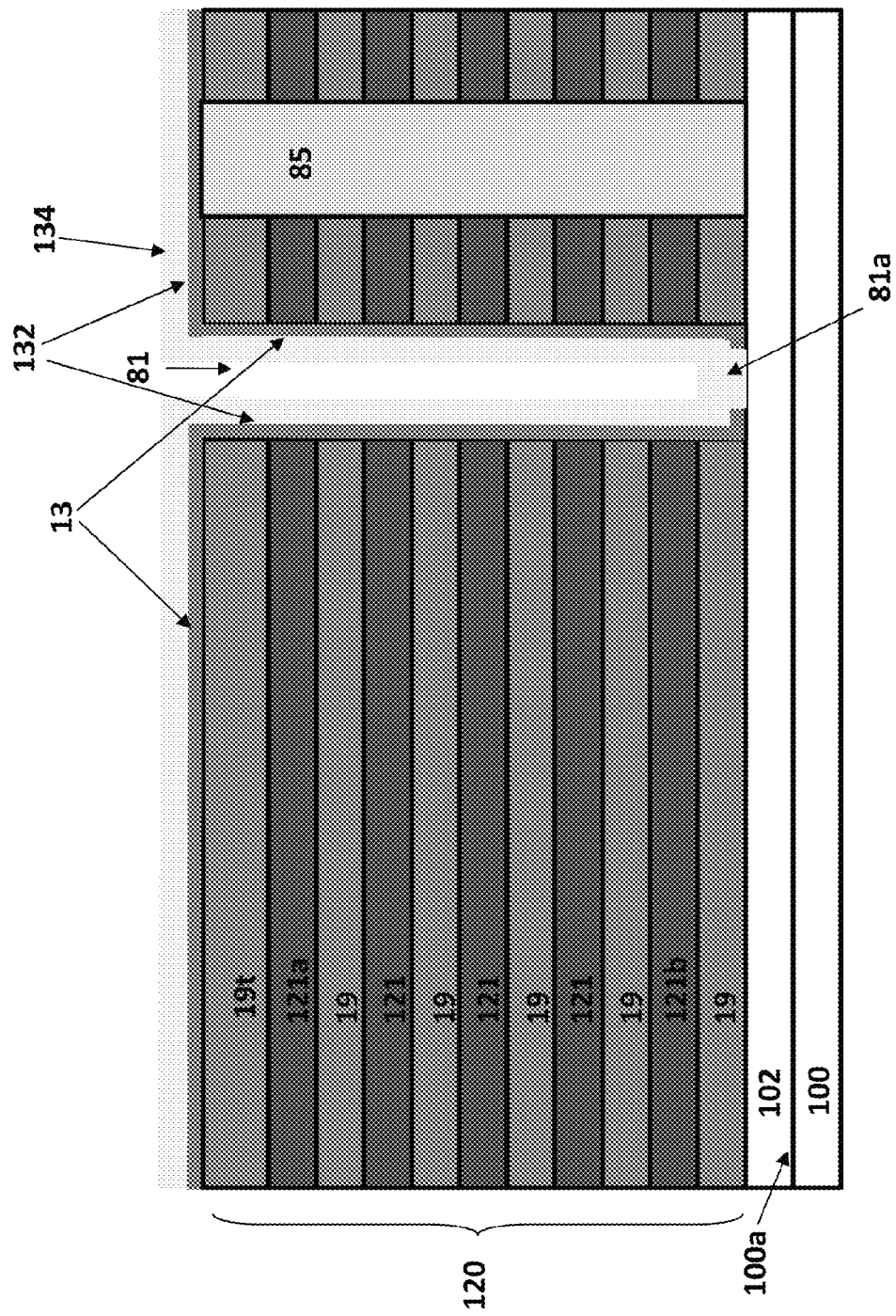

As shown in FIG. 16, a semiconductor channel body layer 134 is formed in the memory opening 81 such that it makes contact with the source line 102, substrate 100, or p-well 302 exposed in the memory opening 81 (e.g., exposed in portions 81a of memory opening 81). The semiconductor channel body layer 134 comprises a channel material, such as amorphous silicon or polysilicon. Layers 132 and 134 may comprise the same materials, and layer 134 contacts layer 132 on the sidewalls of the memory opening 81.

Figure 17:
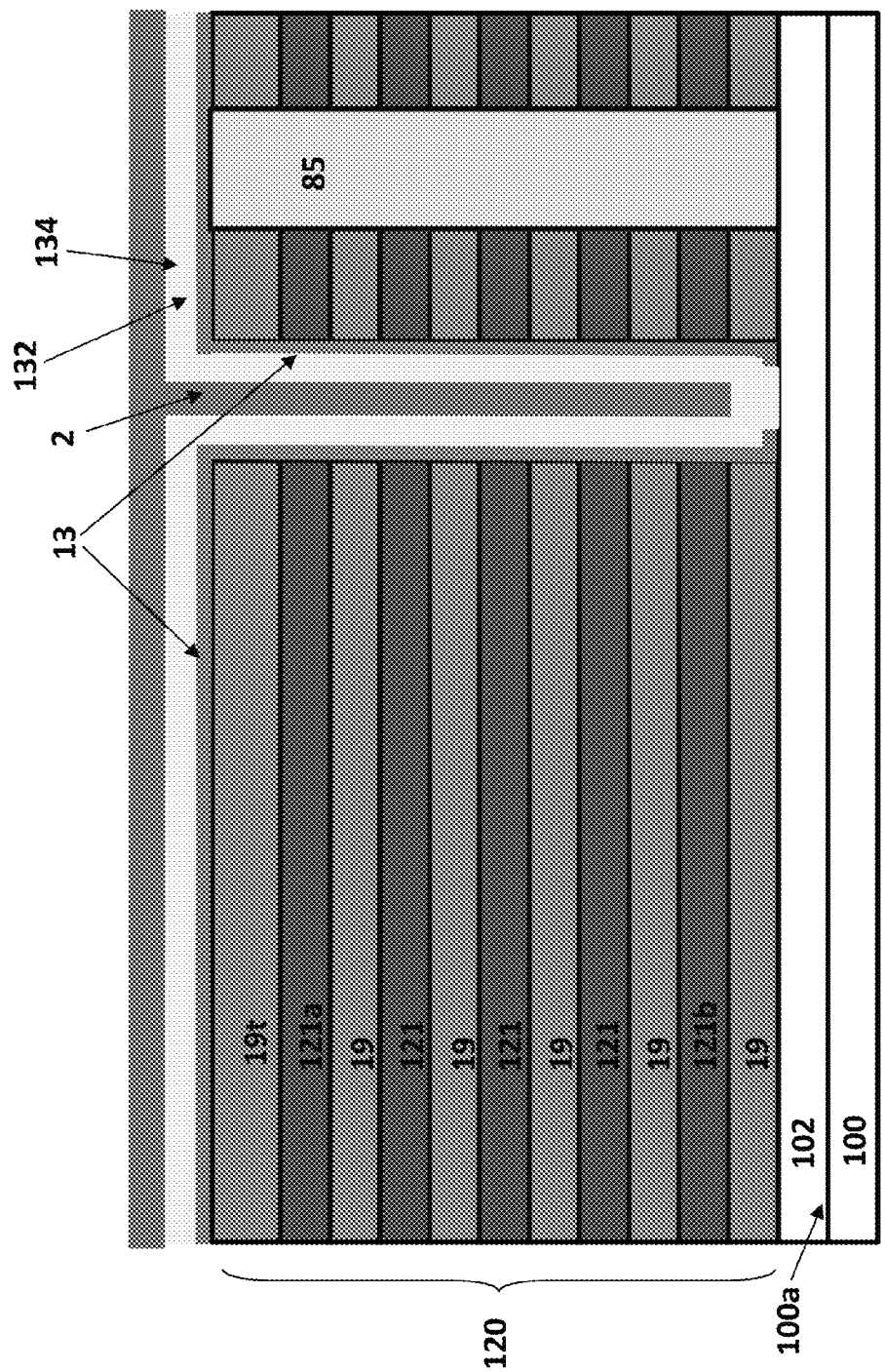
Figure 18:
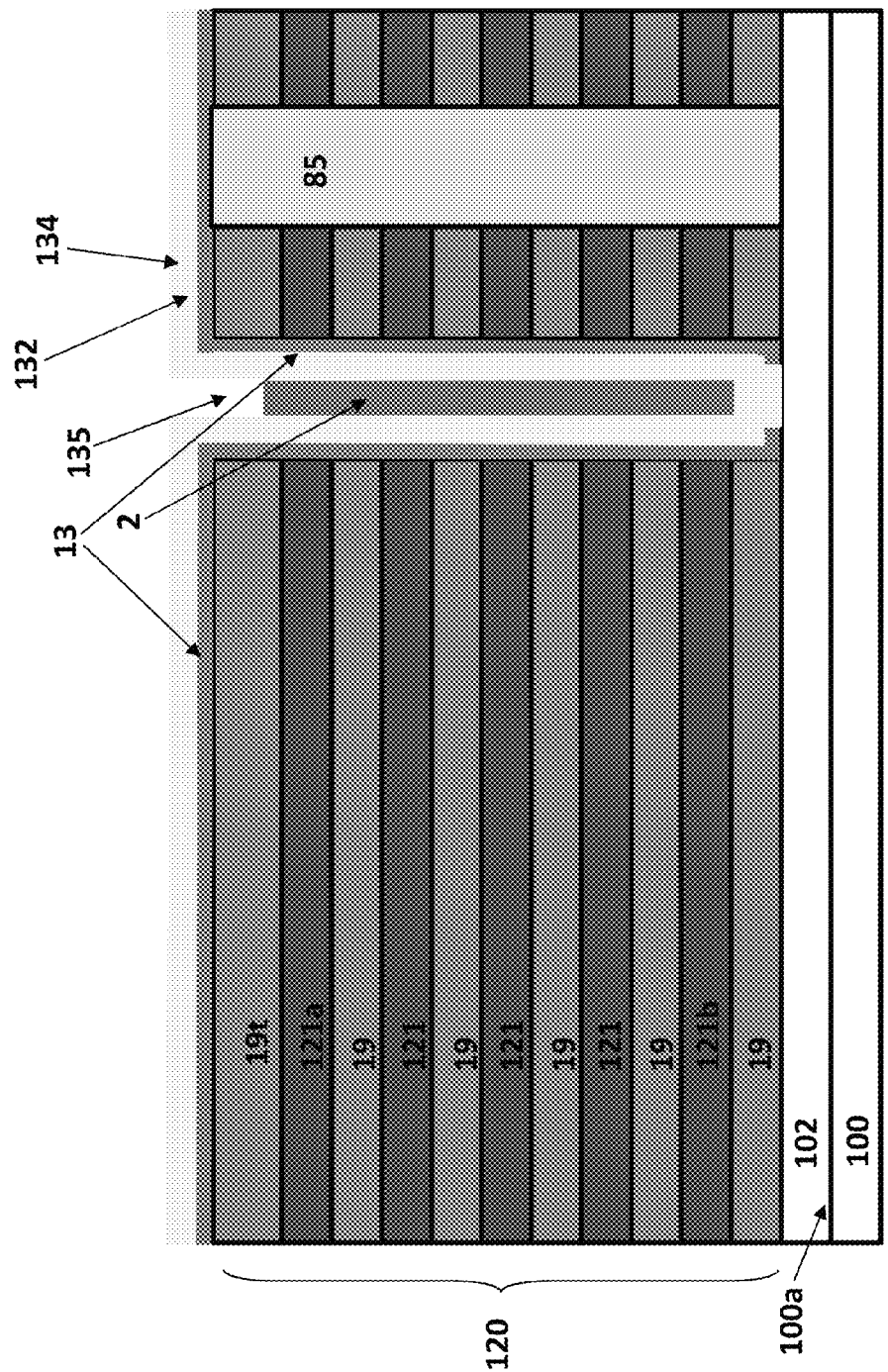

The optional core insulating layer 2, such as a silicon oxide layer is then deposited in the memory opening 81 and over the stack 120, as shown in FIG. 17. Layer 2 is also shown in FIGS. 4A and 4B. The core insulating layer 2 is then recessed from the top of the memory opening 81 by selective etchback to form a recess 135 in the top of the memory opening 81, as shown in FIG. 18.

Figure 19:
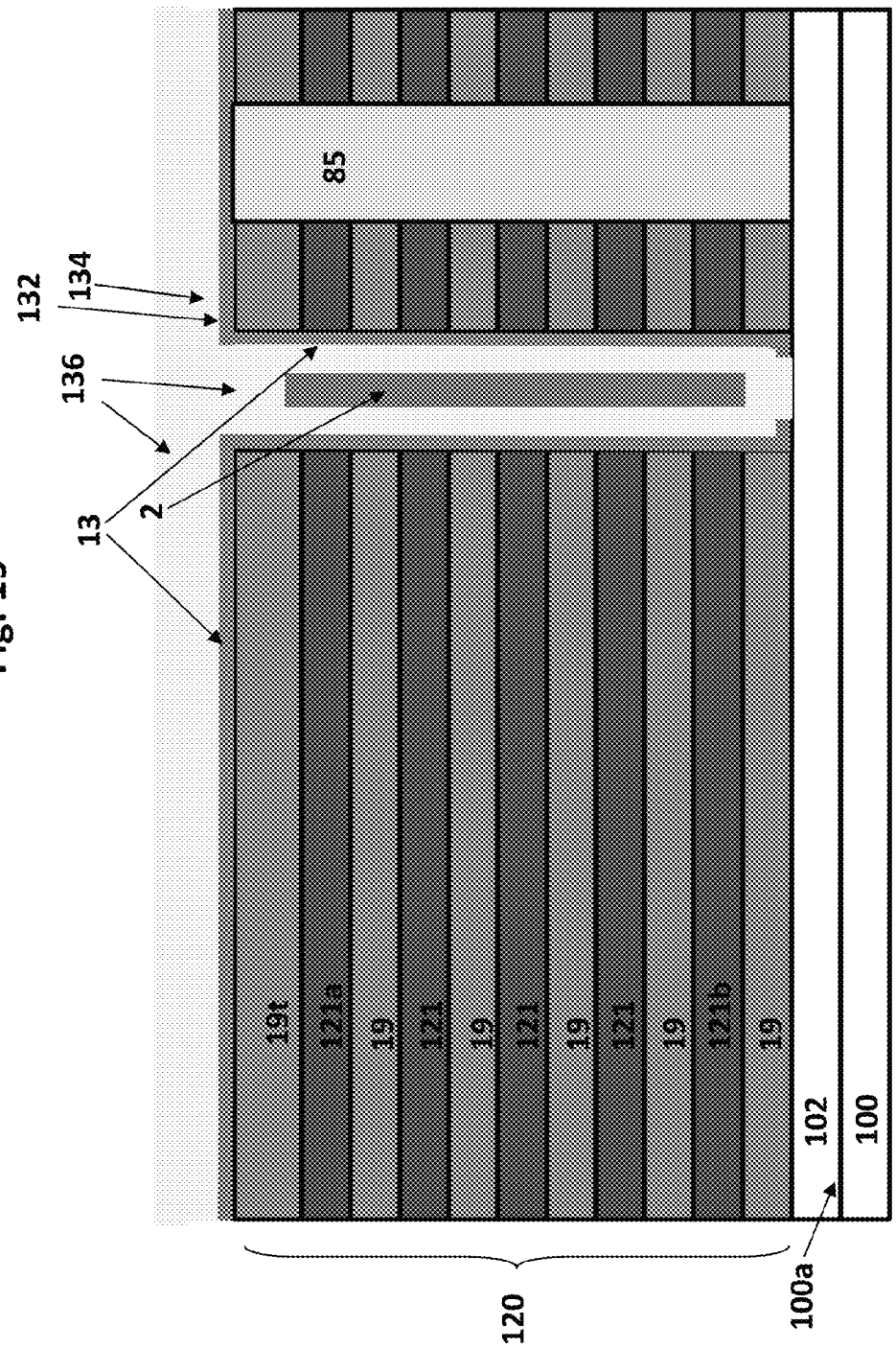

The recess 135 is then filled by a semiconductor cap layer 136 which is deposited conformally over layer 134 on the stack 120 and in the recess 135, as shown in FIG. 19. The cap layer 136 comprises a channel semiconductor material, such as amorphous silicon or polysilicon. Layer 136 may comprise the same material as layers 132 and 134. Layer 136 completely fills the recess 135 and contacts layer 134 on the sidewalls of the recess 135 in the memory opening 81.

Figure 20:
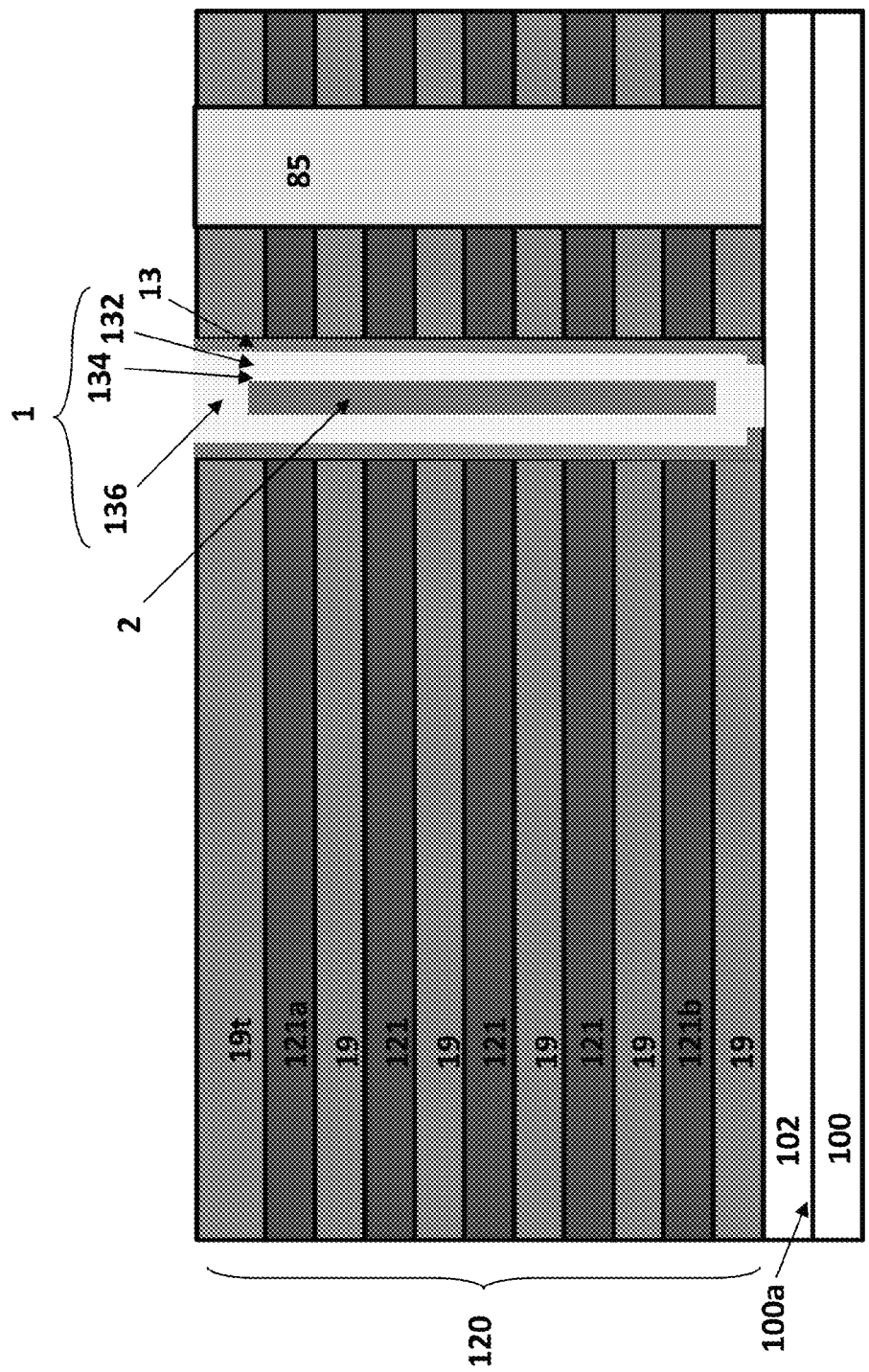

As shown in FIG. 20, the semiconductor channel layers 132, 134 and 136 are then planarized by etch back or CMP to remove these layers from the top of the stack 120 to expose the upper silicon oxide layer 19t of the stack and the top of the cover layer 85. The channel layers 132, 134 and 136 remain in the memory opening 81 and together form the above described channel 1 in the memory device levels 70. The cover layer 85 is then removed from the dummy opening 82 using a selective etch or ashing (if cover layer 85 comprises a carbon layer).

Thus, as shown in FIG. 20, the channel 1 of the embodiment of FIGS. 11-18 is composed of three sublayers 132, 134, 136. Sublayer 132 comprises an outer hollow cylinder or hollow inverse truncated cone which contacts the memory film 13 with its outer surface. Sublayer 132 does not contact the source line 102.

Sublayer 134 comprises an inner hollow cylinder or hollow inverse truncated cone which contacts sublayer 132 with its outer surface. Sublayer 134 contacts the core insulating layer 2 with its inner surface in the lower portion of the opening 81 and contacts sublayer 136 with its inner surface in the upper portion of the opening 81. In some embodiments, sublayer 134 completely fills the extension portion 81a of the opening 81 and contacts the source line 102.

Sublayer 136 comprises a filled cylinder or filled inverse truncated cone which is located only in the upper portion of the opening 81. Sublayer 136 contacts sublayer 134 with its outer surface. Sublayer 136 also contacts the top of the core insulating layer 2 with its bottom surface.

Figure 21:
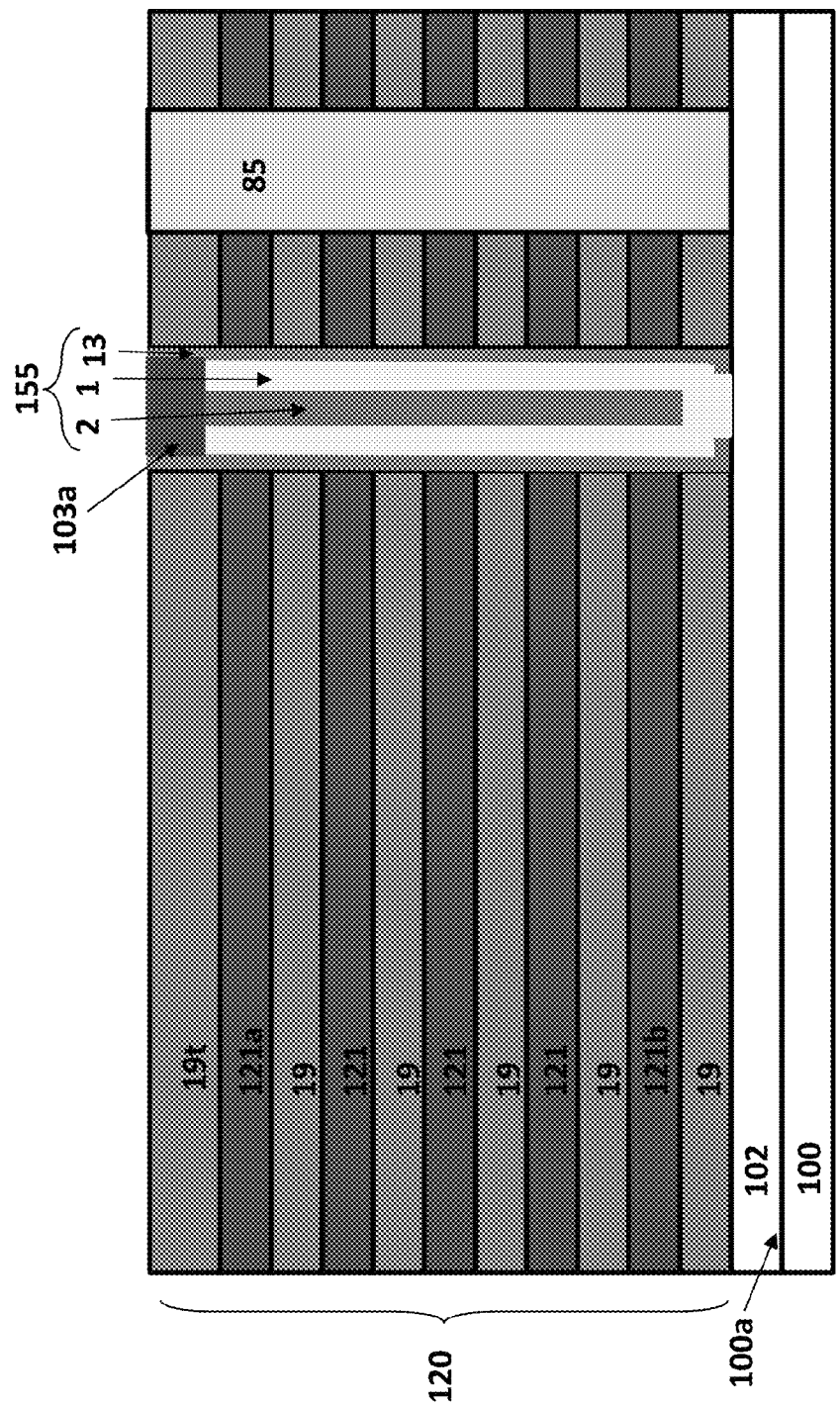

As shown in FIG. 21, a top portion of the polysilicon channel 1 is doped to form a doped drain 103a. The memory film 13, semiconductor channel 1, and core insulating layer 2 together form memory opening material 155.

Figure 22:
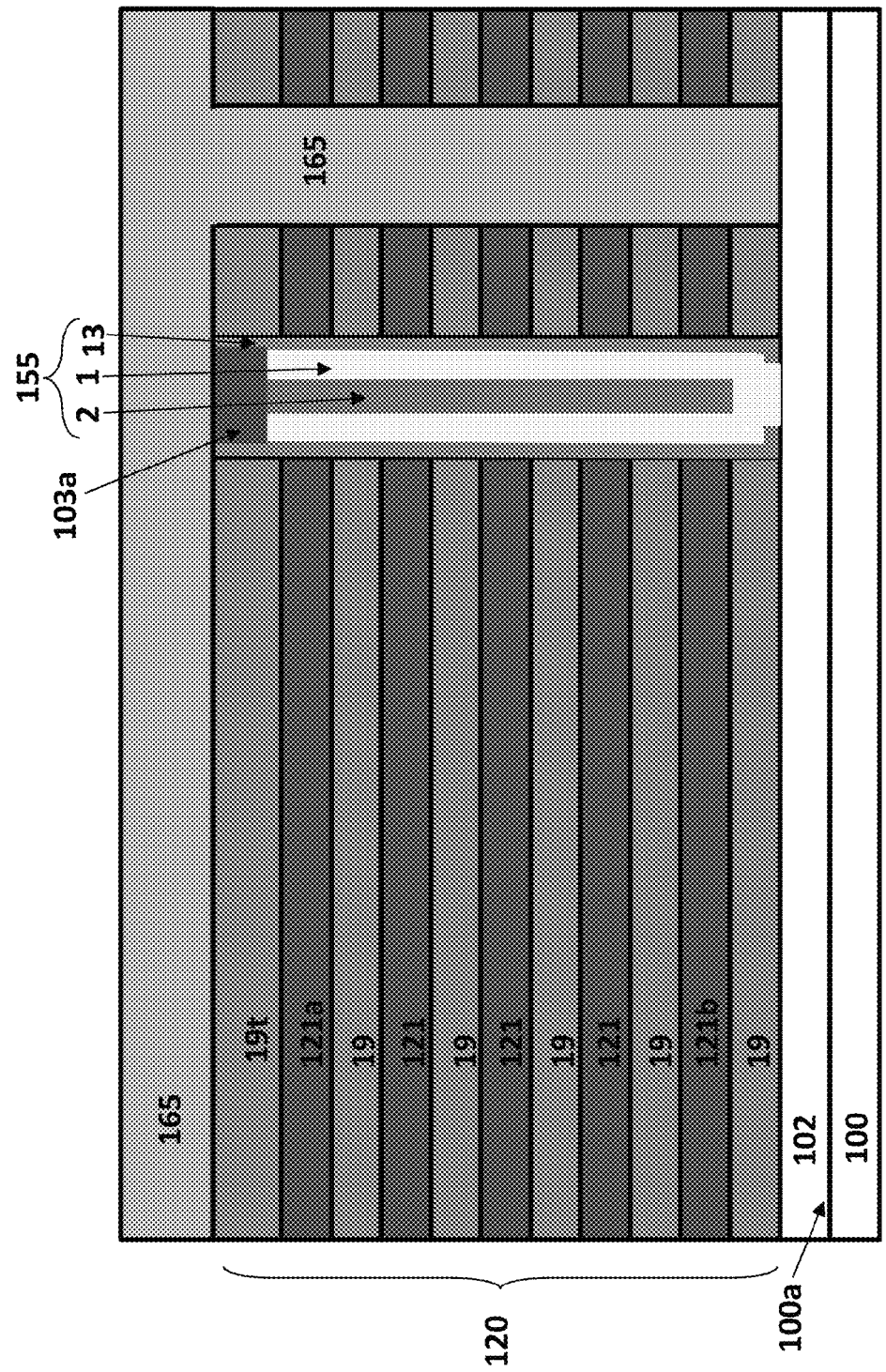
Figure 23:
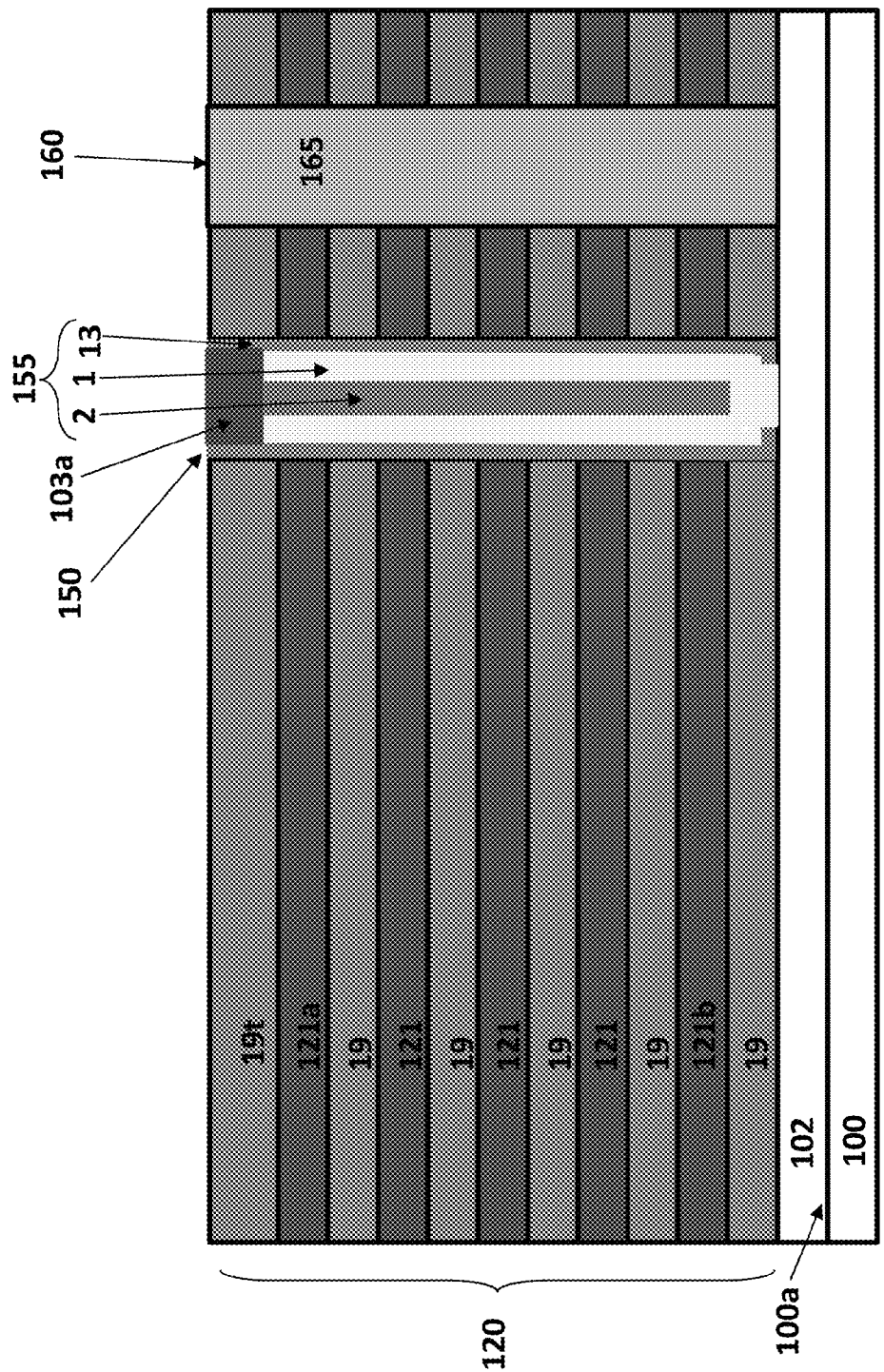

Dummy openings 82 are then filled with a dummy channel material to form a dummy channel 160. The dummy openings 82 may be filled before or after the memory film 13 and semiconductor channel 1 are deposited in the memory openings 81. First, as shown in FIG. 22, dummy opening 82 is filled with a dummy channel material 165 to form a dummy channel 160. The dummy channel material may be any suitable material or combination of materials having a higher Young's modulus than the memory opening material 155. Dummy channel material 165 is filled into dummy opening 82 and over stack 120. The dummy channel material 165 is then is planarized or etched back to remove dummy channel material 165 from over the stack 120, leaving dummy channel material 165 only in dummy opening 82, as shown in FIG. 23.

Figure 24:
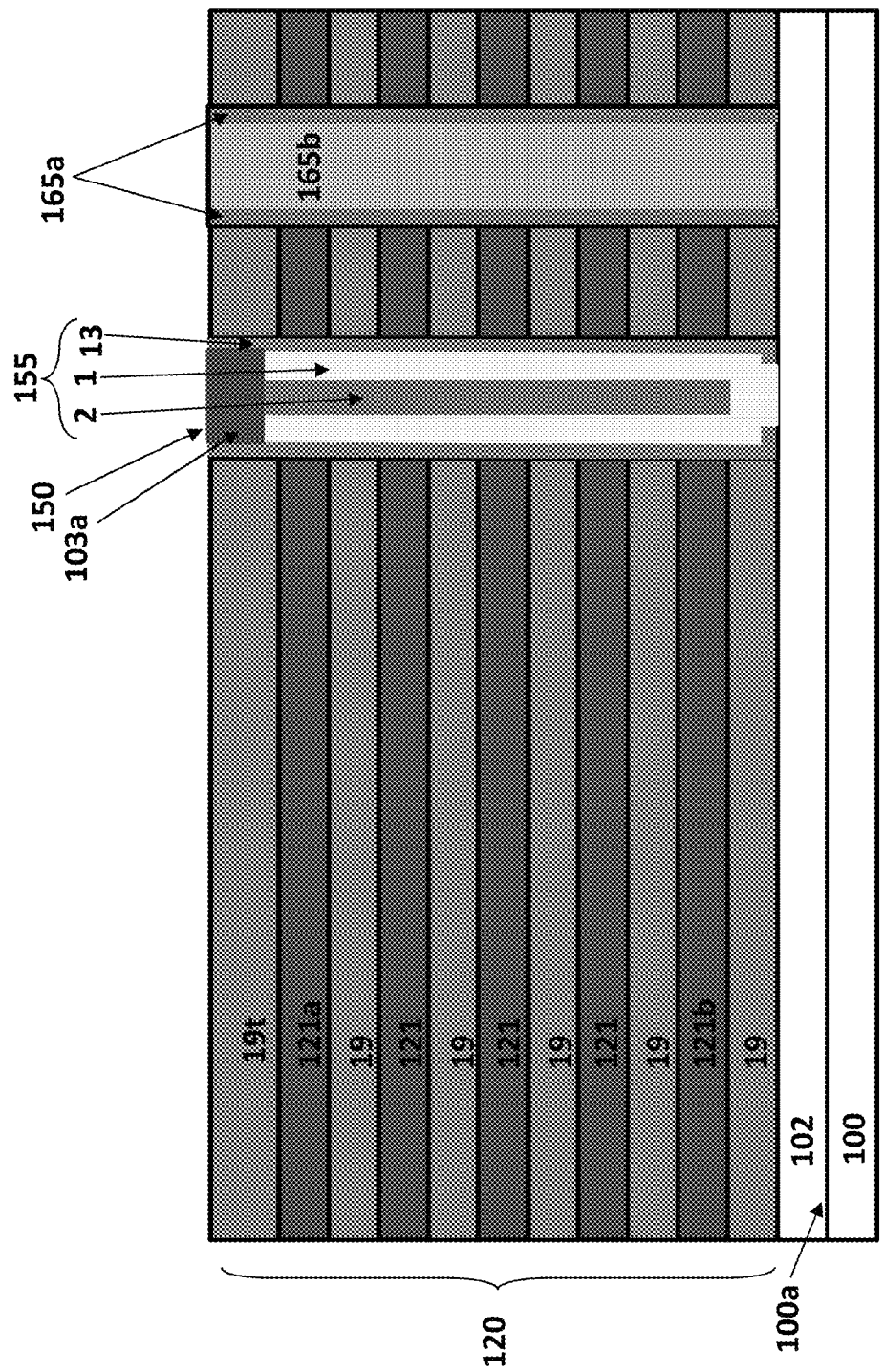
FIG. 24 is a side cross sectional view of an alternative embodiment of the device illustrated in FIGS. 1 and 2A-2C along line C-C' in FIG. 2A.

Alternatively, as shown in FIG. 24, a first, electrically insulating dummy channel material 165a partially fills the dummy opening 82 and covers at least the side walls of dummy opening 82 to form a shell. A second dummy channel material 165b is then deposited in the dummy opening 82 to form a core. The second dummy channel material 165b may electrically insulating, conductive, or a semiconductor material.

In an alternative embodiment, the dummy channel material 165 is formed prior to the formation of the memory opening material 155. After the dummy opening 82 and memory opening 81 are formed, a cover layer is formed in the memory opening 81. The dummy channel material is then formed in the dummy opening 82. The cover layer is removed from the memory opening 81, and memory opening 81 is filled with the memory opening material 155 (e.g., semiconductor channel 1 and memory film 13).

In another alternative embodiment, the memory opening 81 is formed first and filled with memory opening material 155 (e.g., semiconductor channel 1 and memory film 13). Subsequently, the dummy opening 82 is then formed and filled with dummy channel material 165 while the memory opening material 155 is covered with a mask.

Alternatively, the dummy opening 82 is formed first and filled with dummy channel material 165. Memory opening 81 is then formed and filled with memory opening material 155 (e.g., semiconductor channel 1 and memory film 13).

Figure 25:
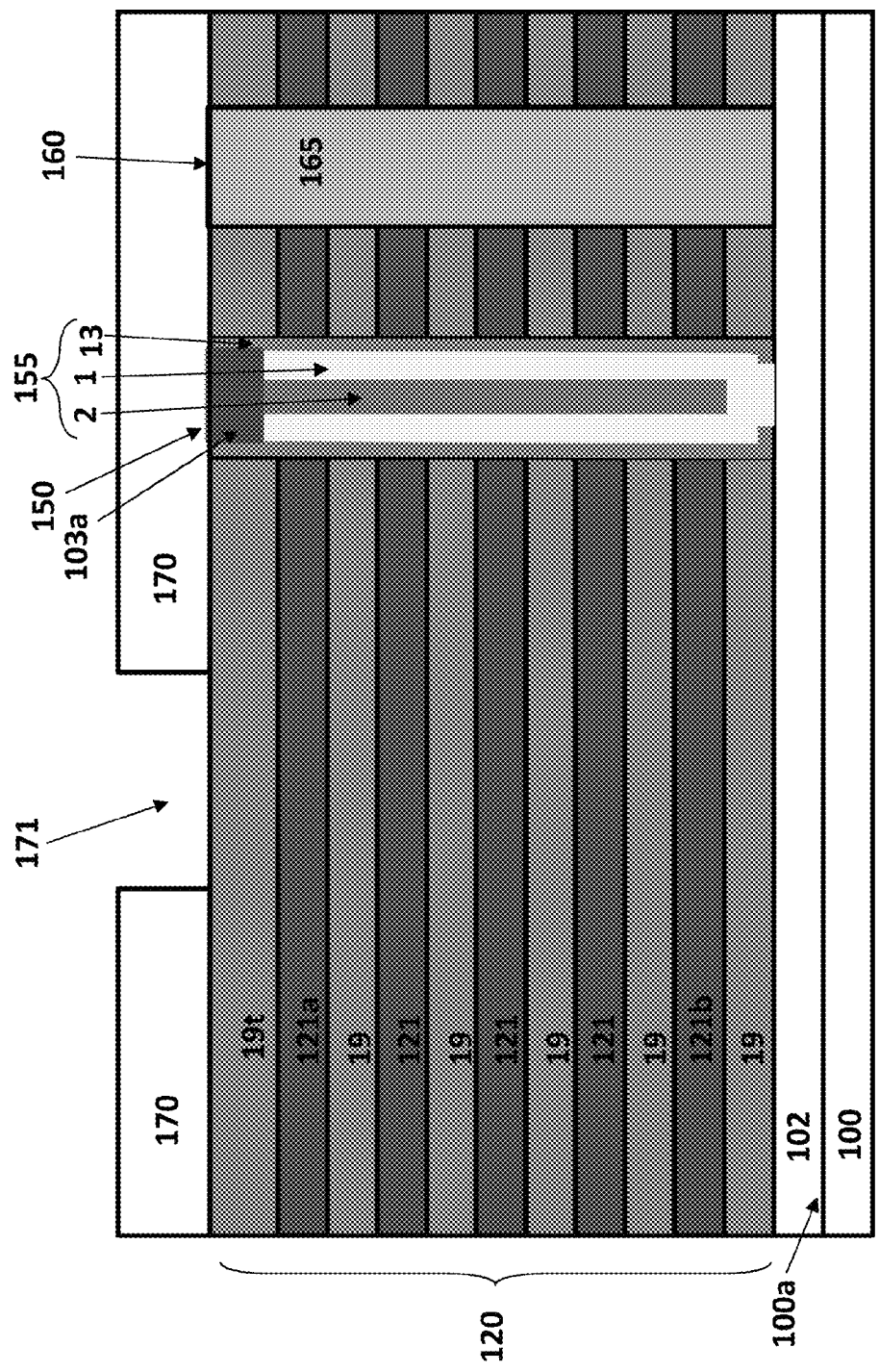
FIGS. 25, 27, and 28 are side cross sectional views illustrating steps in an embodiment method of making the device illustrated in FIGS. 1 and 2A-2C in a location outside the boundary shown in FIG. 2A.
Figure 26:
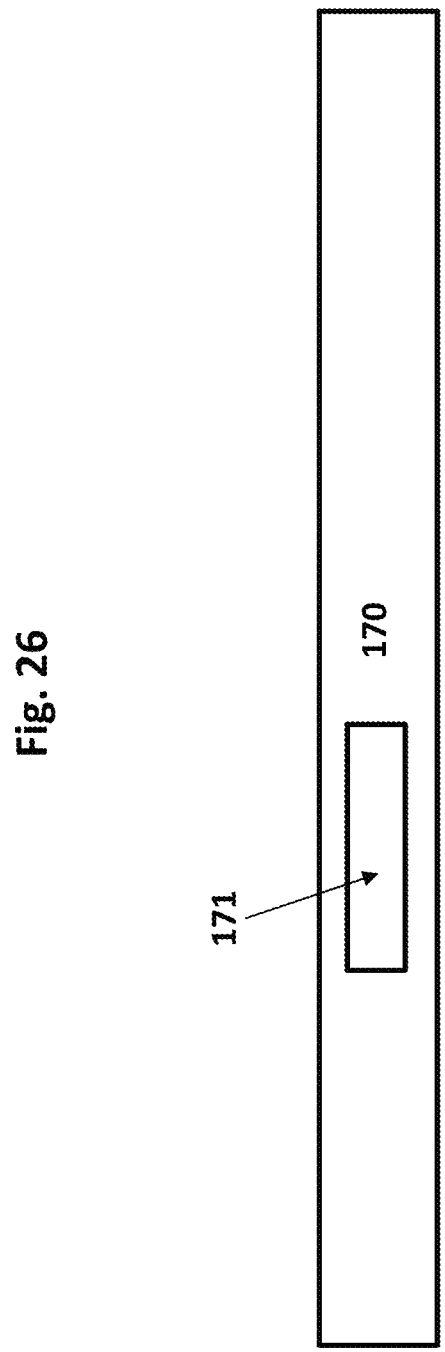
FIG. 26 is a top view of the step shown in FIG. 25.
Figure 27:
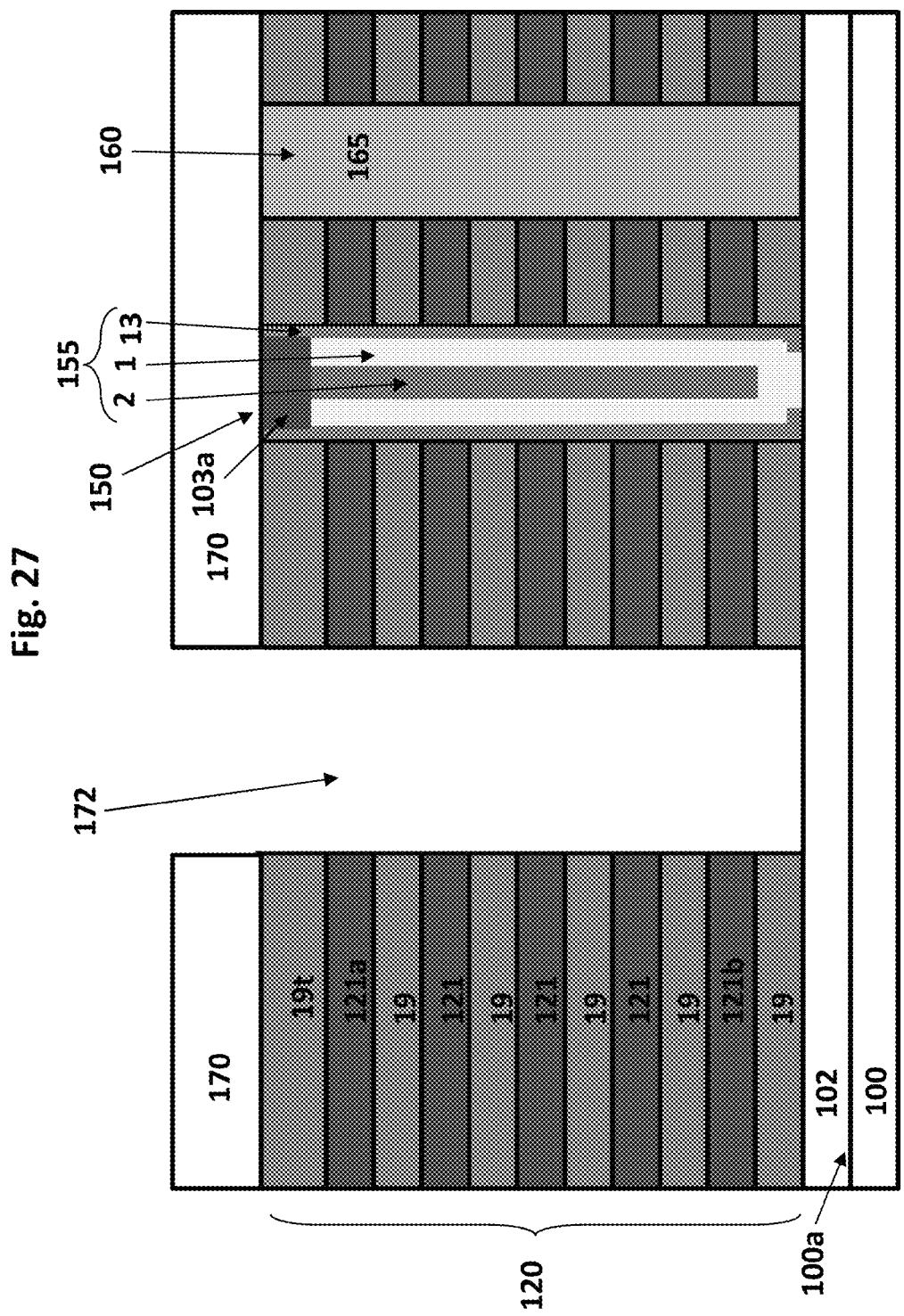
Figure 28:
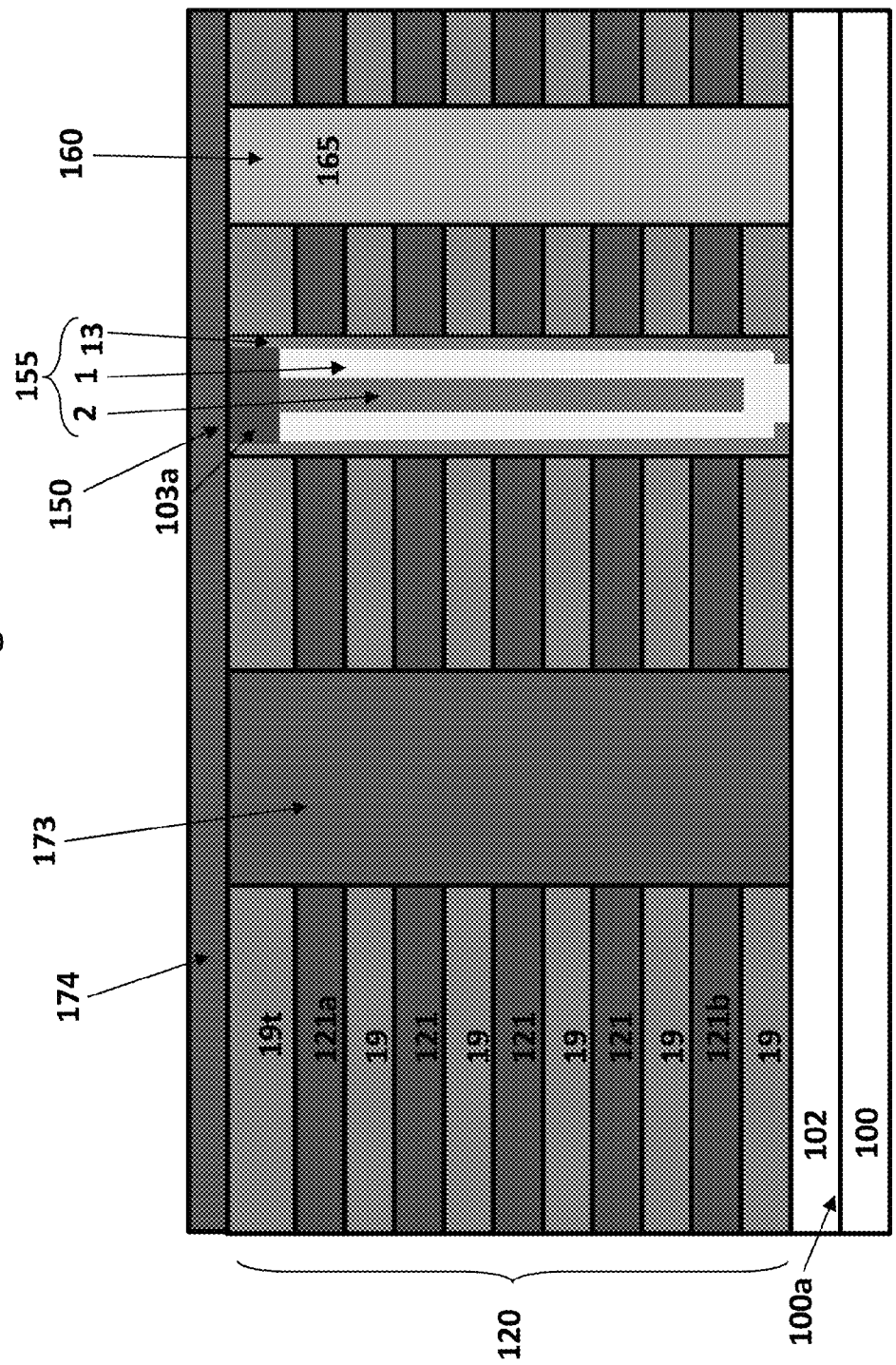

FIGS. 25-28 illustrate the formation of a support column which supports the stack layers after the sacrificial layer 121 are removed. FIGS. 25, 27, and 28 are side cross sectional views which have the same direction as the view in FIG. 23, but which are shifted into or out of the plane of the drawing in FIG. 23.

As shown in FIG. 25, a mask 170 is formed over the device and a column opening 171 is formed in the mask 170 to expose the upper silicon oxide layer 19t of the stack.

FIG. 26 shows the top view of the mask 170 having the opening 171.

As shown in FIG. 27, a column opening 172 is etched through all of the layers in the stack to the source line 102 using RIE or another suitable method.

Finally, as shown in FIG. 28, the insulating support column 173 is formed in the column opening 172. The column 173 may be formed by depositing an insulating layer 174, such as a silicon oxide layer into the opening 172 and over the remaining device layers followed by planarization, such as a CMP planarization. While only one column 173 is shown in the figures, more than one column may be formed at the same time.

Figure 29:
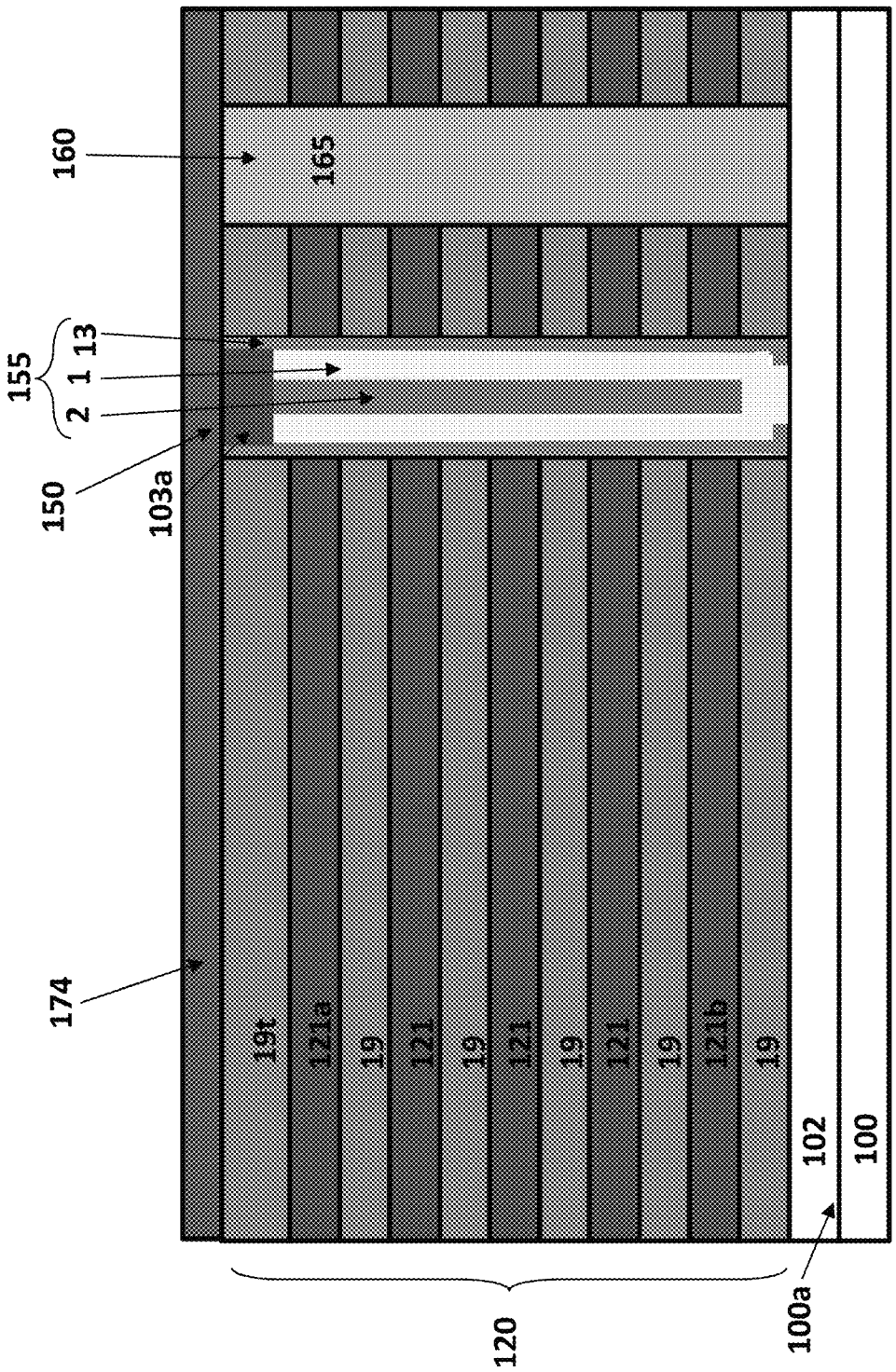

FIG. 29 shows the same cross sectional view as FIG. 23 after the formation of the column(s) 173 and layer 174. The view in FIG. 29 is in or out of the plane of the drawing in FIG. 28, such that the column 173 is not visible in FIG. 29.

FIGS. 30-40 illustrate a method of forming the trenches (e.g., back side openings) 84 and the source electrode 202.

Figure 30:
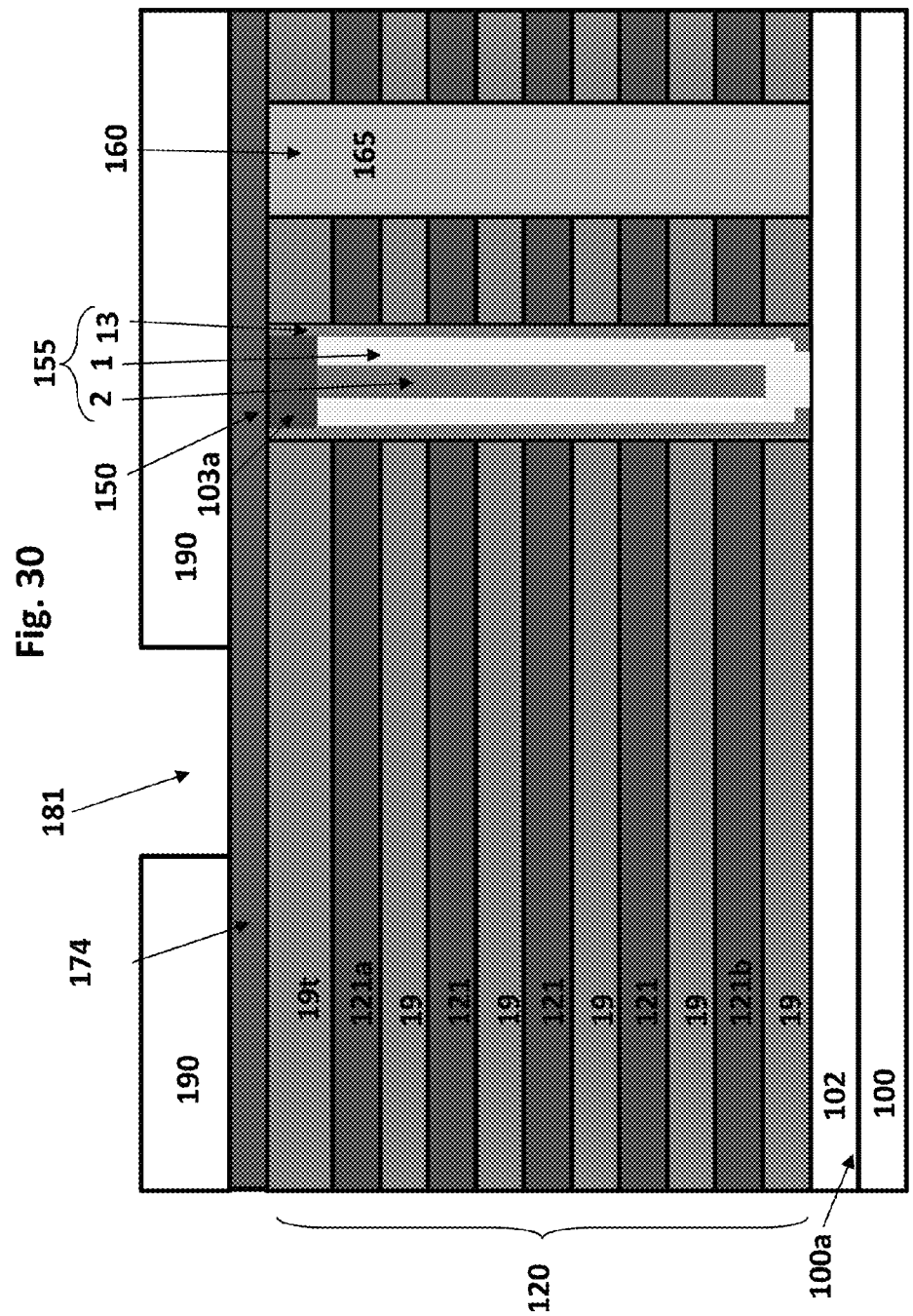

As shown in FIG. 30, a mask 190 is formed over layer 174. The mask 190 may be a photoresist and/or hard mask described above. At least one back side mask opening 181 is formed in the mask. In some embodiments, a plurality of openings 181 are formed in the mask 190.

Figure 31:
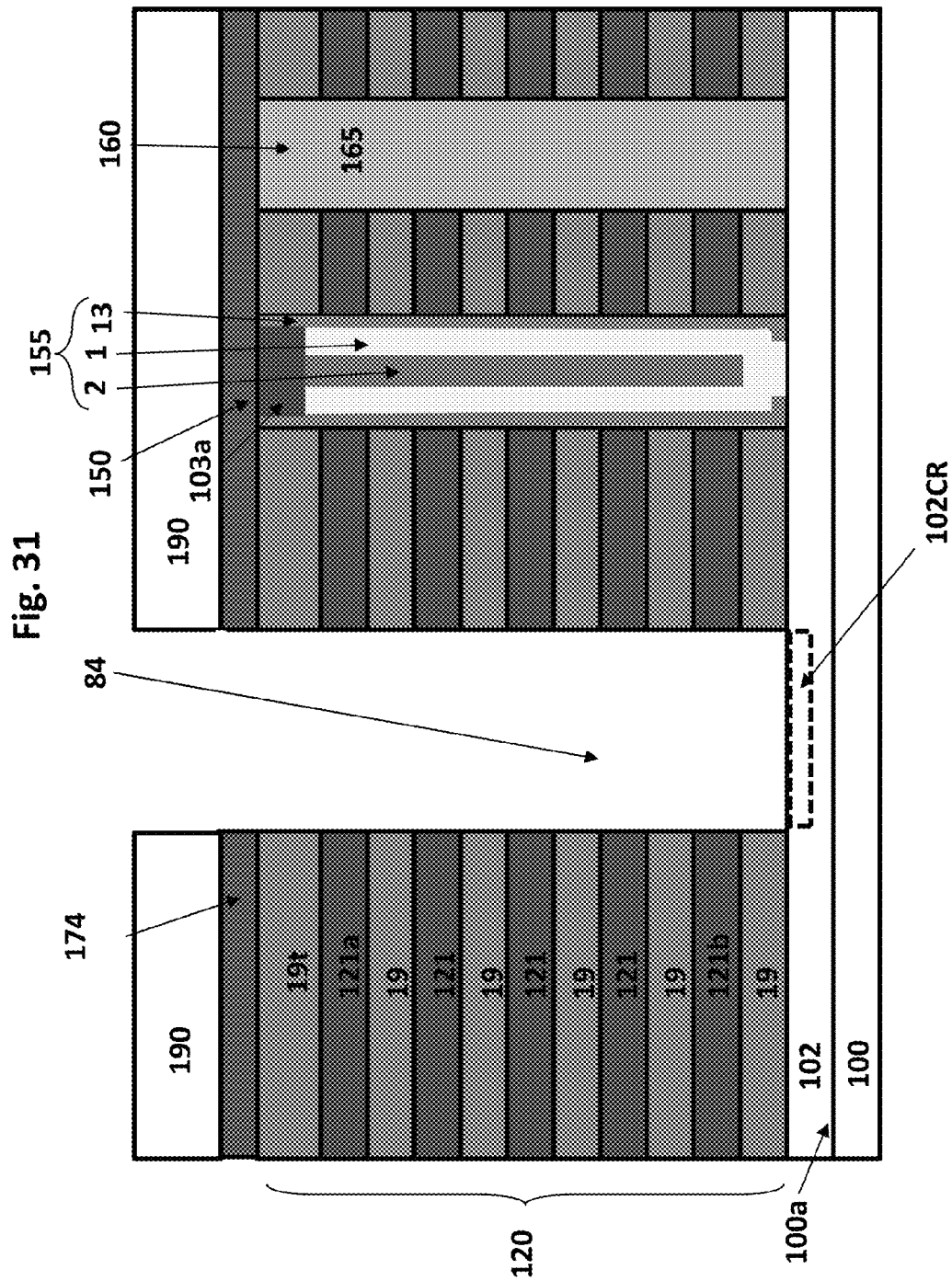

Then, as shown in FIG. 31, layer 174 and the stack 120 are etched through the openings 181 in the mask to form the back side openings (e.g., the trenches) 84 in the stack 120 extending to the source line 102. Thus, the step of forming the back side openings 84 forms back side trenches which exposes the source line 102, which may act as an etch stop.

If the source line 102 comprises lightly or moderately doped polysilicon (e.g., n-type polysilicon), then dopants (e.g., n-type dopants, such as arsenic or phosphorus and/or p-type dopants, such as boron) may optionally be implanted into the source line 102 through opening 84 to form a heavily doped contact region 102CR in the source line 102 which will contact the source electrode 202 which will be formed in the opening 84. In an embodiment both n-type and p-type dopants are implanted to form an N−/P+ region 102CR followed by an activation anneal. If source line 102 is omitted, then dopants are implanted into the substrate 100 to form doped source region 102a in substrate 100 or p-well 302, as shown in FIG. 3C. The mask 190 may then be removed, as shown in FIG. 32.

Then, at least a portion of the sacrificial second material layers 121 are removed through the back side openings 84 to form back side recesses 182 between the first material layers 19, as shown in FIG. 33. Layers 121 may be removed by selective etching, such as a silicon nitride selective etching which removes silicon nitride layers 121 but does not remove the silicon oxide layers 174, 19 and 7 or the silicon regions (e.g., source line 102). The selective etch may stop on the oxide blocking dielectric, such as a silicon oxide blocking dielectric 7 which forms the outer part of the memory film 13. The support column 173 described above supports the spaced apart layers 19 of the stack 120 and prevents layers 19 from collapsing on each other.

Alternatively, blocking dielectric can optionally be formed in back side recesses 182 instead of being formed in memory opening 81.

Metal or metal alloy control gate electrodes 3 are then formed in the back side recesses 182 through the back side openings 84, as shown in FIG. 34. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner and tungsten gate material. This fill can result in mechanical stress imposed on the substrate, which can lead to substrate and/or wafer warpage.

If dummy channel material 165 is a single layer, then the dummy channel material 165 is an electrically insulating material to avoid creating a short circuit between the control gate electrodes 3. If dummy channel material 165 includes two or more layers, as shown in FIG. 24, then the outer layer (e.g., 165a in FIG. 24) is an electrically insulating material (e.g. silicon oxide) to avoid creating a short circuit between the control gate electrodes. The inner core 165b may be an electrically conductive material (e.g., tungsten).

Then, as shown in FIG. 35, the portion 183 of the metal or metal alloy control gate material is removed by anisotropic etching from the back side openings (e.g., trenches) 84 and from over layer 174 without removing the control gate electrodes 3 to complete the formation of the control gate electrodes 3. The select gate electrodes 33, 34 may be formed above and below the control gate electrodes 3 at the same time or during a different step.

Figure 36:
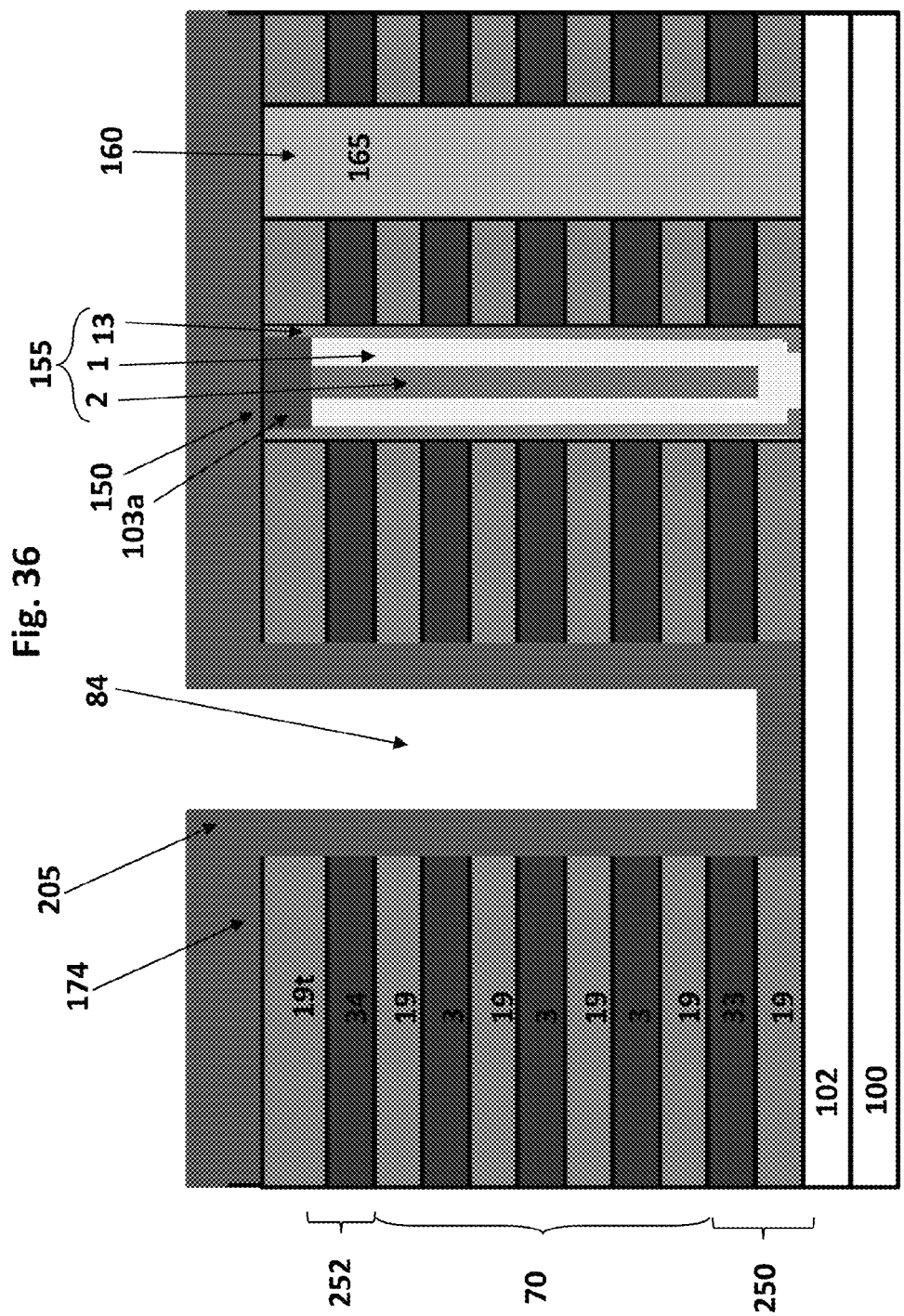
Figure 37:
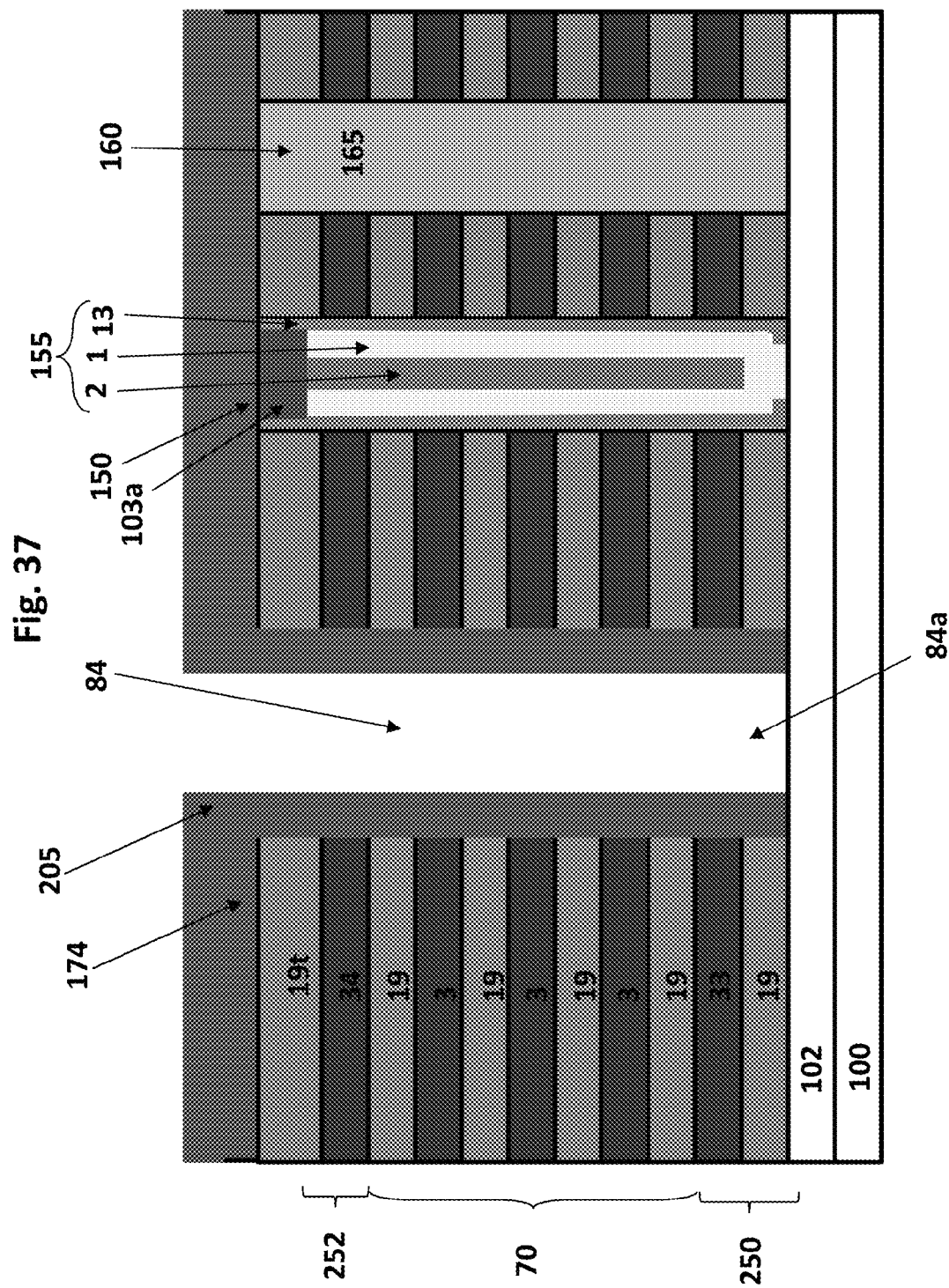

The insulating layer 205, such as a silicon oxide layer, is formed on sidewalls and bottom of the back side trenches 84, as shown in FIG. 36. Layer 205 is also formed over layer 174. The insulating layer 205 is then removed from the bottom 84a of the back side trench 84 by anisotropic etching (e.g., by RIE spacer etch) without removing the insulating layer from the sidewalls of the trench 84, as shown in FIG. 37. This etching step exposes the source line 102 through the bottom 84a of the trench 84.

Figure 38:
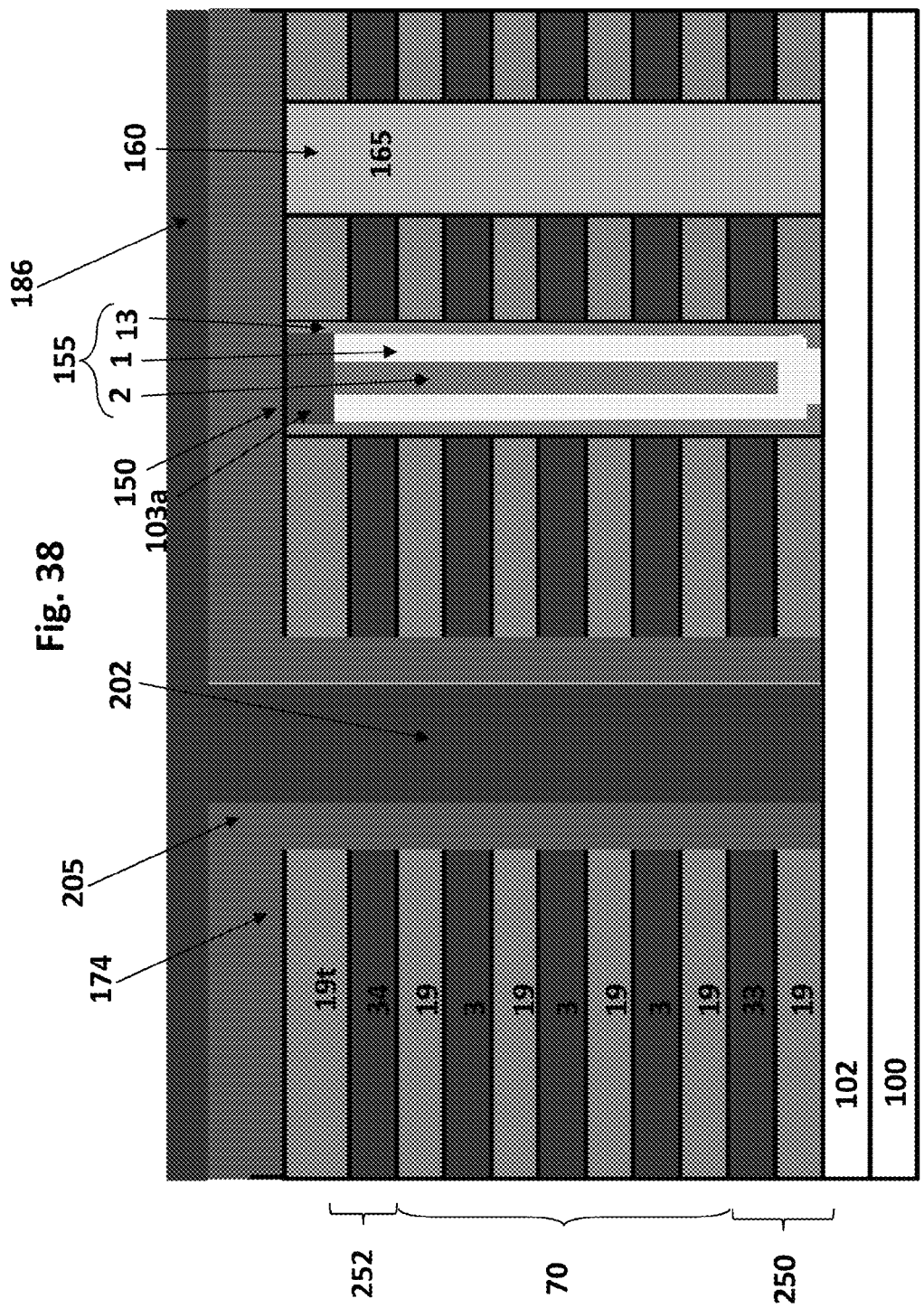
Figure 39:
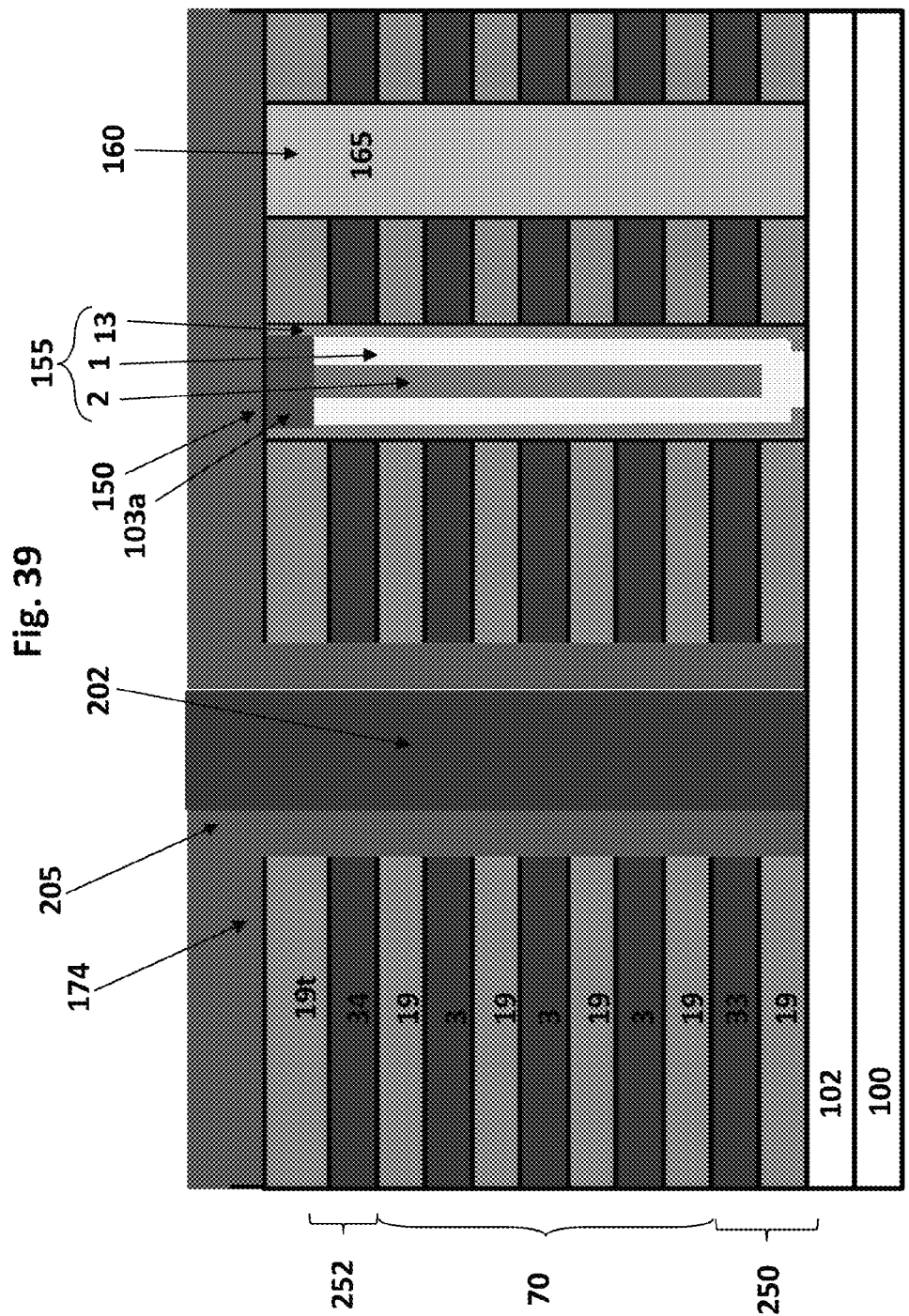

The source electrode 202 is then formed in the back side trench 84 in contact with the source line 102, as shown in FIG. 38. The source electrode 202 may be formed by depositing any suitable metal or metal alloy layers, such as TiN, ruthenium, and/or tungsten over layer 205 in the trenches 84. A portion 186 of the source electrode material located over the device is removed by CMP or etching to leave the source electrode 202 in the dielectrically insulated trenches 84, as shown in FIG. 39.

Figure 40:
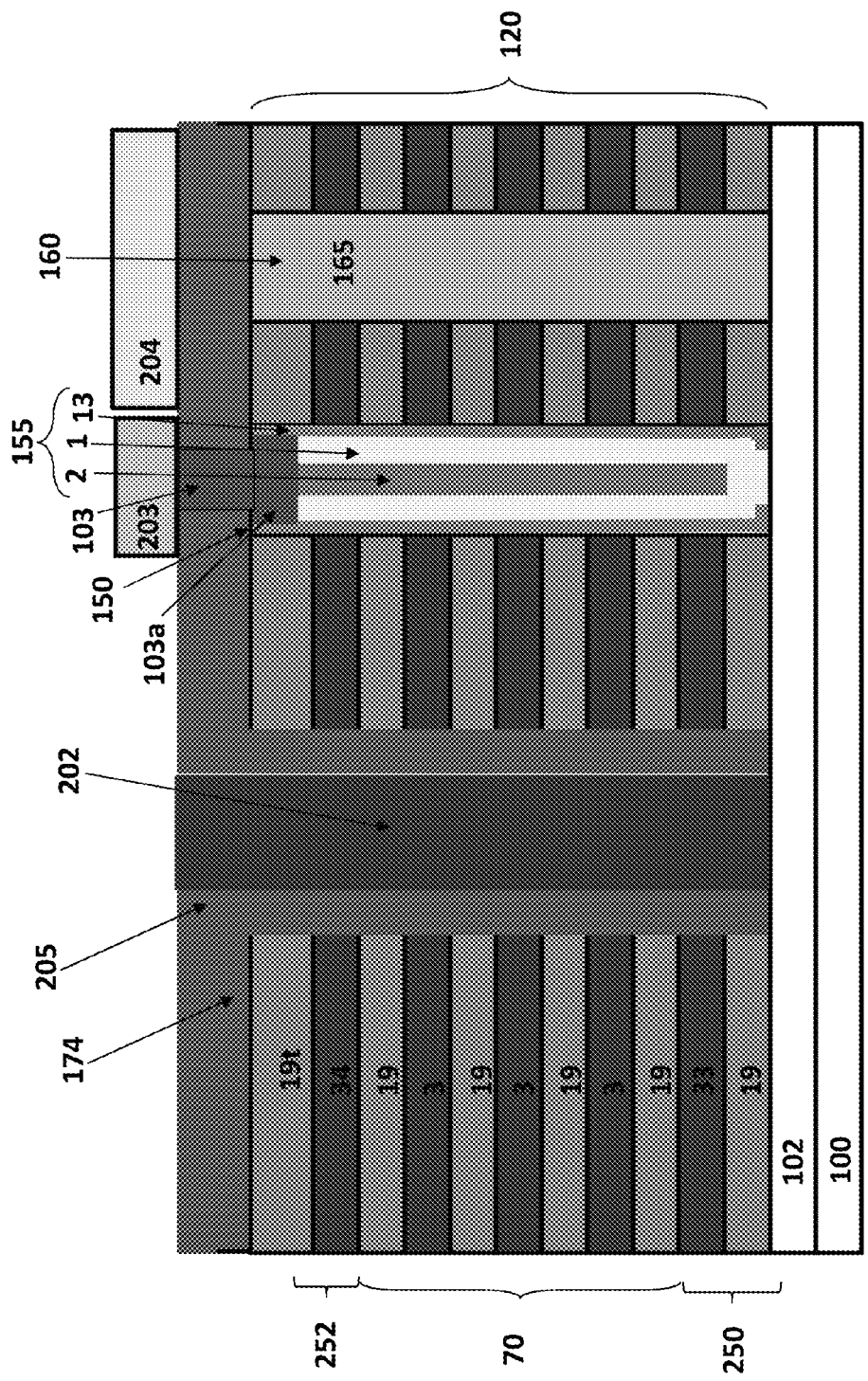

An electrode shunt 204 electrically connected to source electrode 202 is formed over the dummy channel 160, as shown in FIG. 40. The electrode shunt contacts source electrode 202 in an area that is out of the plane of FIG. 40, which is a side cross sectional view along the line C-C' of FIG. 2A. In some embodiments, the shunt 204 is electrically isolated from the dummy channel 160 by insulating layer 174.

A drain line 103 in contact with doped drain 103a is formed in an opening in layer 174. A bit line (drain electrode) 203 in contact with drain line 103 is formed above the drain, as shown in FIG. 40.

While formation of a portion of one memory block 400 is shown in FIGS. 6 to 40, it should be understood that the same method may be used to form one or more than one memory blocks 400 shown in FIG. 5. The method to form other memory block(s) 400 includes forming a second back side trench 84b, forming a second source electrode 202a in the second back side trench, and forming at least one row of front side memory openings 81, such as an least a 4×4 array of front side memory openings, between the first back side trench 84 and the second back side trench 84b. The method also includes forming an optional blocking dielectric 7 in each of the memory openings 81, forming a charge storage region 9 over the blocking dielectric in each of the memory openings, and forming a tunnel dielectric 11 over the charge storage region in each of the memory openings. The method also includes removing the blocking dielectric, the charge storage region and the tunnel dielectric from the bottom of each of the memory openings 81, forming a semiconductor channel in each of the memory openings in contact with the optional source line 102, or the substrate 100 or p-well 302.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three dimensional NAND string, comprising:
  a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level, and wherein the plurality of control gate electrodes extend through at least one memory cell region and at least one dummy channel region;
  an interlevel insulating layer located between the first control gate electrode and the second control gate electrode;
  a memory opening located in the at least one memory cell region and extending substantially perpendicular to the major surface of the substrate, the memory opening filled with a memory opening material comprising:
    a semiconductor channel located at least partially in the memory opening, at least one end portion of the semiconductor channel extending substantially perpendicular to the major surface of the substrate, at least one first portion of the semiconductor channel located in a first device level, and at least one second portion of the semiconductor channel located in a second device level; and at least one memory film located at least partially in the memory opening and adjacent to the semiconductor channel;

one of a source or drain electrode which contacts the semiconductor channel from above or below; and at least one dummy opening having a circular cross sectional shape when viewed from above located in the at least one dummy channel region, the at least one dummy opening extending substantially perpendicular to the major surface of the substrate and filled with a dummy channel material which is different from the memory opening material, wherein the dummy channel material contacts a sidewall of the interlevel insulating layer in the dummy opening;

wherein the dummy channel material has a higher Young's modulus than the memory opening material to offset warpage of the substrate due to one of compressive and tensile stress imposed by the plurality of control gate electrodes on the substrate.

2. The monolithic three dimensional NAND string of claim 1, further comprising an electrode shunt extending substantially parallel to the major surface of the substrate and connected to the one of the source or drain electrode, the electrode shunt comprising a conductive electrode shunt material, wherein the dummy channel region is located under the electrode shunt.

3. The monolithic three dimensional NAND string of claim 1, wherein the dummy channel material comprises a material under compressive stress and the plurality of control gate electrodes are under tensile stress.

4. The monolithic three dimensional NAND string of claim 1, wherein the dummy channel material comprises a single material or a combination of more than one material, and the single dummy channel material or the combination dummy channel material has a higher Young's modulus than the memory opening material.

5. The monolithic three dimensional NAND string of claim 1, wherein:
the plurality of control gate electrodes comprise an electrically conductive material; and
the dummy channel material comprises an electrically insulating material, or an electrically insulating shell and an electrically conductive or semiconductor core.

6. The monolithic three dimensional NAND string of claim 5, wherein:
the semiconductor channel material comprises silicon;
the plurality of control gate electrodes comprise tungsten or a tungsten alloy; and
the dummy channel material comprises silicon nitride, or a silicon oxide shell and a tungsten core.

7. The monolithic three dimensional NAND string of claim 1, wherein the at least one memory film comprises:
a blocking dielectric located in contact with the plurality of control gate electrodes and the interlevel insulating layer;
at least one charge storage region located at least partially in contact with the blocking dielectric; and
a tunnel dielectric located between the at least one charge storage region and the semiconductor channel.

8. The monolithic three dimensional NAND string of claim 7, further comprising an insulating core fill layer contacting the semiconductor channel.

9. The monolithic three dimensional NAND string of claim 1,
wherein the semiconductor channel has a pillar shape and extends substantially perpendicular to the major surface of the substrate; and
further comprising one of a source or drain electrode which contacts the pillar-shaped semiconductor channel from above, and another one of a source or drain electrode which contacts the pillar-shaped semiconductor channel from below.

10. The monolithic three dimensional NAND string of claim 1,
wherein the semiconductor channel has U-shaped pipe shape,
wherein two wing portions of the U-shaped pipe shape semiconductor channel extend substantially perpendicular to the major surface of the substrate and a connecting portion of the U-shaped pipe shape semiconductor channel which connects the two wing portions extends substantially parallel to the major surface of the substrate; and
wherein the one of a source or drain electrode contacts the first wing portion of the semiconductor channel from above; and
further comprising another one of a source or drain electrode which contacts the second wing portion of the semiconductor channel from above.

11. The monolithic three dimensional NAND string of claim 2, wherein:
the semiconductor channel has J-shaped pipe shape;
a wing portion of the J-shaped pipe shape semiconductor channel extends substantially perpendicular to the major surface of the substrate and a connecting portion of the J-shaped pipe shape semiconductor channel which connects to the wing portion extends substantially parallel to the major surface of the substrate; and
the one of a source or drain electrode comprises a drain electrode contacts the first wing portion of the semiconductor channel from above; and
further comprising a source electrode which contacts the connecting portion of the semiconductor channel from above.

12. The monolithic three dimensional NAND string of claim 11, wherein:
the source electrode comprises a rail shaped electrode which electrically contacts the electrode shunt;
the source electrode is located in a dielectric insulated trench;
the source electrode extends substantially parallel to the plurality of control gate electrodes and substantially perpendicular to the electrode shunt;
the drain electrode is electrically connected to a bit line which is located above the semiconductor channel;
the bit line extends substantially perpendicular to the plurality of control gate electrodes and to the source electrode, and substantially parallel to the electrode shunt.

13. A method of making a monolithic three dimensional NAND string, comprising:
forming a stack of alternating first layers and second layers, wherein the stack of alternating first layers and second layers extend substantially parallel to a major surface of a substrate;
etching the stack to form at least one memory opening and at least one dummy opening having a circular cross sectional shape when viewed from above, the at least one memory opening and the dummy opening extending substantially perpendicular to the major surface of the substrate;
forming a memory opening material comprising a semiconductor channel and a memory film in the at least one memory opening;
forming a dummy channel material which is different from the memory opening material in the at least one dummy opening, wherein the dummy channel material contacts a sidewall of the second layers in the dummy opening and wherein the dummy channel material has a higher Young's modulus than the memory opening material; and
forming a bit line over the semiconductor channel and the memory film located in the at least one memory opening.

14. The method of claim 13, further comprising forming an electrode shunt extending over the dummy channel material located in the at least one dummy opening.

15. The method of claim 13, wherein the at least one dummy opening is substantially the same size and shape as the at least one memory opening.

16. The method of claim 13, wherein the first layers comprise sacrificial layers and the second layers comprise insulating layers, and the method further comprises:
forming at least one back side opening in the stack;
selectively removing the first layers through the back side opening to form a plurality of back side recesses between the second layers; and
forming a plurality of control gate electrodes in the back side recesses.

17. The method of claim 16, wherein the plurality of control gate electrodes are under one of compressive and tensile stress and the dummy channel material has a higher Young's modulus than the memory opening material to offset warpage of the substrate due to the one of compressive and tensile stress imposed by the plurality of control gate electrodes on the substrate.

18. The method of claim 13, wherein the dummy channel material comprises a single material or a combination of more than one material, and the single dummy channel material or the combination dummy channel material has a higher Young's modulus than the memory opening material.

19. The method of claim 16, wherein:
the plurality of control gate electrodes comprise an electrically conductive material; and
the dummy channel material comprises an electrically insulating material, or an electrically insulating shell and an electrically conductive or semiconductor core.

20. The method of claim 19, wherein:
the semiconductor channel material comprises silicon;
the plurality of control gate electrodes comprise tungsten or a tungsten alloy; and
the dummy channel material comprises silicon nitride, or a silicon oxide shell and a tungsten core.

21. The method of claim 13, wherein:
the dummy channel has a circular cross section when viewed from above; and
the semiconductor channel has a circular cross section when viewed from above.

22. The method of claim 13, wherein:
the semiconductor channel has J-shaped pipe shape;
a wing portion of the J-shaped pipe shape semiconductor channel extends substantially perpendicular to the major surface of the substrate and a connecting portion of the J-shaped pipe shape semiconductor channel which connects to the wing portion extends substantially parallel to the major surface of the substrate;
a source region is located in electrical contact with the connecting portion and a drain region is located in electrical contact with the wing portion of the J-shaped pipe shape semiconductor channel; and
the back side opening comprises a trench which extends substantially perpendicular to the bit line.

23. The method of claim 22, further comprising:
forming an insulating layer on sidewalls of the trench;
forming a source electrode in the trench in contact with the source region; and
forming a drain electrode in contact with the drain region located above the semiconductor channel and in electrical contact with the bit line.

24. The method of claim 13, wherein:
etching the stack to form at least one memory opening and at least one dummy opening comprises a single etching step or separate etching steps;
the step of forming the semiconductor channel and the memory film in the at least one memory opening occurs before or after the step of forming the dummy channel material in the at least one dummy opening;
the step of forming the semiconductor channel and the memory film in the at least one memory opening occurs while the at least one dummy opening is either masked or filled with the dummy channel material;
the step of forming the dummy channel material in the at least one dummy opening occurs while the at least one memory opening is either masked or filled with the semiconductor channel and the memory film; and
the memory film comprises a blocking dielectric formed in at least one of the memory opening or the back side opening, a tunnel dielectric formed in the memory opening and at least one charge storage region located between the blocking dielectric and the tunnel dielectric.

25. A monolithic three dimensional NAND memory device, comprising:
a silicon substrate;
an array of monolithic three dimensional NAND strings having a plurality of device levels disposed above the silicon substrate; and
a driver circuit associated with the array located above or in the silicon substrate;
wherein each monolithic three dimensional NAND string of the array of monolithic three dimensional NAND strings comprises:
a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level, and wherein the plurality of control gate electrodes extend through at least one memory cell region and at least one dummy channel region;
an interlevel insulating layer located between the first control gate electrode and the second control gate electrode;
a memory opening located in the at least one memory cell region and extending substantially perpendicular to the major surface of the substrate, the memory opening filled with a memory opening material comprising:

a semiconductor channel located at least partially in the memory opening, at least one end portion of the semiconductor channel extending substantially perpendicular to the major surface of the substrate, at least one first portion of the semiconductor channel located in a first device level, and at least one second portion of the semiconductor channel located in a second device level, and at least one memory film located at least partially in the memory opening; and one of a source or drain electrode which contacts the semiconductor channel from above or below;

at least one dummy opening having a circular cross sectional shape when viewed from above located in the at least one dummy channel region, the at least one dummy opening extending substantially perpendicular to the major surface of the substrate and filled with a dummy channel material which is different from the memory opening material, wherein the dummy channel material contacts a sidewall of the interlevel insulating layer in the dummy opening; and a source electrode is located in a dielectric insluated trench which is different from the at least one dummy opening filled with the dummy channel material;

wherein the plurality of control gate electrodes are under one of compressive and tensile stress and the dummy channel material has a higher Young's modulus than the memory opening material to offset warpage of the substrate due to the one of compressive and tensile stress imposed by the plurality of control gate electrodes on the substrate.

\* \* \* \* \*